(12) United States Patent
Noguchi et al.

(10) Patent No.: US 10,784,557 B2
(45) Date of Patent: Sep. 22, 2020

(54) SIGNAL PROCESSING CIRCUIT, SIGNAL PROCESSING MODULE, AND COMMUNICATION APPARATUS

(71) Applicant: Sony Semiconductor Solutions Corporation, Kanagawa (JP)

(72) Inventors: Kenji Noguchi, Kanagawa (JP); Kazumasa Kohama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/294,402

(22) Filed: Mar. 6, 2019

(65) Prior Publication Data

US 2019/0237842 A1 Aug. 1, 2019

Related U.S. Application Data

(63) Continuation of application No. 15/554,870, filed as application No. PCT/JP2016/057739 on Mar. 11, 2016, now Pat. No. 10,276,911.

(30) Foreign Application Priority Data

Mar. 27, 2015 (JP) .................. 2015-065744

(51) Int. Cl.
*H01P 5/18* (2006.01)
*H01P 1/24* (2006.01)
*H03H 7/48* (2006.01)

(52) U.S. Cl.
CPC ............ *H01P 5/184* (2013.01); *H01P 1/24* (2013.01); *H03H 7/48* (2013.01)

(58) Field of Classification Search
CPC .............. H01P 5/18; H01P 5/184; H01P 1/24

USPC .................................. 333/109, 116
See application file for complete search history.

(56) References Cited

U.S. PATENT DOCUMENTS

| 5,053,733 | A | 10/1991 | Oldfield |
| 8,175,554 | B2 | 5/2012 | Camuffo et al. |
| 9,614,269 | B2 | 4/2017 | Srirattana et al. |
| 10,276,911 | B2 * | 4/2019 | Noguchi ............ H01P 1/24 |
| 2011/0057746 | A1 | 3/2011 | Yamamoto et al. |
| 2014/0266499 | A1 | 9/2014 | Noe |
| 2016/0172737 | A1 * | 6/2016 | Srirattana ........... H01P 5/185 333/111 |

FOREIGN PATENT DOCUMENTS

JP 2013-247675 A 12/2013

* cited by examiner

*Primary Examiner* — Dean O Takaoka
(74) *Attorney, Agent, or Firm* — Michael Best & Friedrich LLP

(57) ABSTRACT

In one example, a signal processing circuit including a directional coupler and a termination part is disclosed. The directional coupler includes a main line as a transmission path of an RF signal and a sub-line constituting a coupled line together with the main line. The termination part includes devices connectable between ground and a first port at an end of the sub-line. The signal processing circuit switches, depending on a frequency of the RF signal, the devices of the termination part to be connected to the first port. The phase of a return signal of a signal input as a coupling signal to the termination part via the first port is opposite to the phase of an isolation signal supplied to a second port at the other end of the sub-line and connected to an output port of the coupling signal.

15 Claims, 22 Drawing Sheets

| | | |
|---|---|---|
| f1 | R1<br>R2<br>C1<br>C2<br>⋮ | ON<br>OFF<br>OFF<br>OFF |
| f2 | R1<br>R2<br>C1<br>C2<br>⋮ | ON<br>OFF<br>ON<br>OFF |
| f3 | R1<br>R2<br>C1<br>C2<br>⋮ | OFF<br>ON<br>OFF<br>OFF |
| f4 | R1<br>R2<br>C1<br>C2<br>⋮ | OFF<br>ON<br>OFF<br>ON |
| ⋮ | ⋮ | |

FIG.4

SIGNAL PROCESSING CIRCUIT, SIGNAL PROCESSING MODULE, AND COMMUNICATION APPARATUS

CROSS REFERENCES TO RELATED APPLICATIONS

The present Application is a Continuation Application of U.S. patent application Ser. No. 15/554,870 filed Aug. 31, 2017, which is a 371 National Stage Entry of International Application No. PCT/JP2016/057739, filed on Mar. 11, 2016, which in turn claims priority from Japanese Application No. 2015-065744, filed on Mar. 27, 2015, the entire contents of which are incorporated herein by reference.

TECHNICAL FIELD

The present technology relates to a signal processing circuit, a signal processing module, and a communication apparatus, and particularly to a signal processing circuit, a signal processing module, and a communication apparatus that are capable of achieving desired coupler characteristics using a microstrip line having an arbitrary line length.

BACKGROUND ART

In a wireless communication device, a directional coupler is provided, for example, between an amplifier of a transmission signal and an antenna. The directional coupler is configured by disposing two microstrip lines constituting a coupled line on a dielectric substrate.

CITATION LIST

Patent Literature

Patent Literature 1: Japanese Patent Application Laid-open No. 2013-247675

DISCLOSURE OF INVENTION

Technical Problem

In order to ensure a certain level or more of coupler characteristics, a length of a transmission/reception signal wavelength λ/4 is required as the line length of the microstrip line. For example, in the case where the line width of the microstrip line is 1.6 mm and the line interval of the microstrip line is 1.0 mm, the line length needs to be not less than 30 mm depending on the characteristics of the dielectric substrate.

Meanwhile, along with the miniaturization of the wireless communication device, it is also desired to miniaturize the directional coupler. In order to achieve miniaturization of the directional coupler, it is necessary to reduce the line length of the microstrip line. However, even when the line length is simply reduced, it may be impossible to ensure desired coupler characteristics.

The present technology has been made in view of the above circumstances to make it possible to achieve desired coupler characteristics by using a microstrip line having an arbitrary line length.

Solution to Problem

A signal processing circuit according to an aspect of the present technology includes: a directional coupler having a main line as a transmission path of an RF signal and a sub-line constituting a coupled line together with the main line; a termination part including a plurality of devices connectable between a first port and ground, the first port being one of ports on both ends of the sub-line; and a control unit that switches, depending on a frequency of the RF signal, the plurality of devices of the termination part to be connected to the first port, a phase of a return signal of a signal input as a coupling signal corresponding to the RF signal to the termination part via the first port being opposite to a phase of an isolation signal supplied to a second port, the second port being the other port of the sub-line and connected to an output port of the coupling signal.

The control unit may switch on/off of switches provided between a plurality of capacitors of the termination part and the first port and between a plurality of resistors of the termination part and the first port.

The first port may be connected to the output port via a first switch, and the second port may be connected to the output port via a second switch. In this case, the signal processing circuit may further include a different termination part including a plurality of devices connectable between the second port and the ground.

When outputting the coupling signal corresponding to a traveling wave component of the RF signal from the output port, the control unit may turn off the first switch, turn on the second switch, and switch the plurality of devices of the termination part to be connected to the first port.

When outputting the coupling signal corresponding to a reflected wave component of the RF signal from the output port, the control unit may turn off the second switch, turn on the first switch, and switch the plurality of devices of the different termination part to be connected to the second port.

An attenuation part and a filter part may be provided between the second port and the output port, and the control unit may control paths of the coupling signal in the attenuation part and paths of the coupling signal in the filter part.

A path to which an inductor is connected in series and a path bypassing the inductor may be provided in parallel between the second port and the output port, and the control unit may switch paths of the coupling signal depending on the frequency of the RF signal.

A capacitor having one electrode connected to the ground may be provided in parallel between the second port and the output port via a switch, and the control unit may switch on/off of the switch of the capacitor depending on the frequency of the RF signal.

A path to which a resistor is connected in series and a path bypassing the resistor may be provided in parallel between the second port and the output port, and the control unit may switch paths of the coupling signal depending on the frequency of the RF signal.

The directional coupler may include a first sub-line and a second sub-line as the sub-line constituting the coupled line together with the main line, the first sub-line having the same line length as that of the main line, the second sub-line having a line length shorter than that of the main line, the termination part may be provided on a side of the first sub-line, and the termination part may be provided on a side of the second sub-line. In this case, the control unit may output the coupling signal to be transmitted through the first sub-line or the coupling signal to be transmitted through the second sub-line depending on the frequency of the RF signal.

The control unit may switch connection of the devices of the termination part on the side of the first sub-line to the first port and outputs the coupling signal to be transmitted through the first sub-line when the frequency of the RF signal is lower than a threshold value, and switch connection of the devices of the termination part on the side of the second sub-line to the first port and outputs the coupling signal to be transmitted through the second sub-line when the frequency of the RF signal is higher than the threshold value.

In an aspect of the present technology, depending on a frequency of the RF signal, the plurality of devices of the termination part to be connected to the first port is switched, a phase of a return signal of a signal input as a coupling signal corresponding to the RF signal to the termination part via the first port being opposite to a phase of an isolation signal supplied to a second port, the second port being the other port of the sub-line and connected to an output port of the coupling signal.

Advantageous Effects of Invention

In accordance with the present technology, it is possible to achieve desired coupler characteristics by using a microstrip line having an arbitrary line length.

It should be noted that the effect described here is not necessarily limitative and may be any effect described in the present disclosure.

BRIEF DESCRIPTION OF DRAWINGS

FIG. 4 is a diagram showing an example of table information.

MODE(S) FOR CARRYING OUT THE INVENTION

Hereinafter, embodiments of the present technology will be described with reference to the drawings. Note that descriptions will be made in the following order.
1. First Embodiment (example of performing adjustment of termination condition)
2. Second Embodiment (example of performing adjustment of termination condition and level adjustment of CF signal)
3. Others 1. First Embodiment <1-1. First Configuration Example of Coupler Module>

Figure 1:
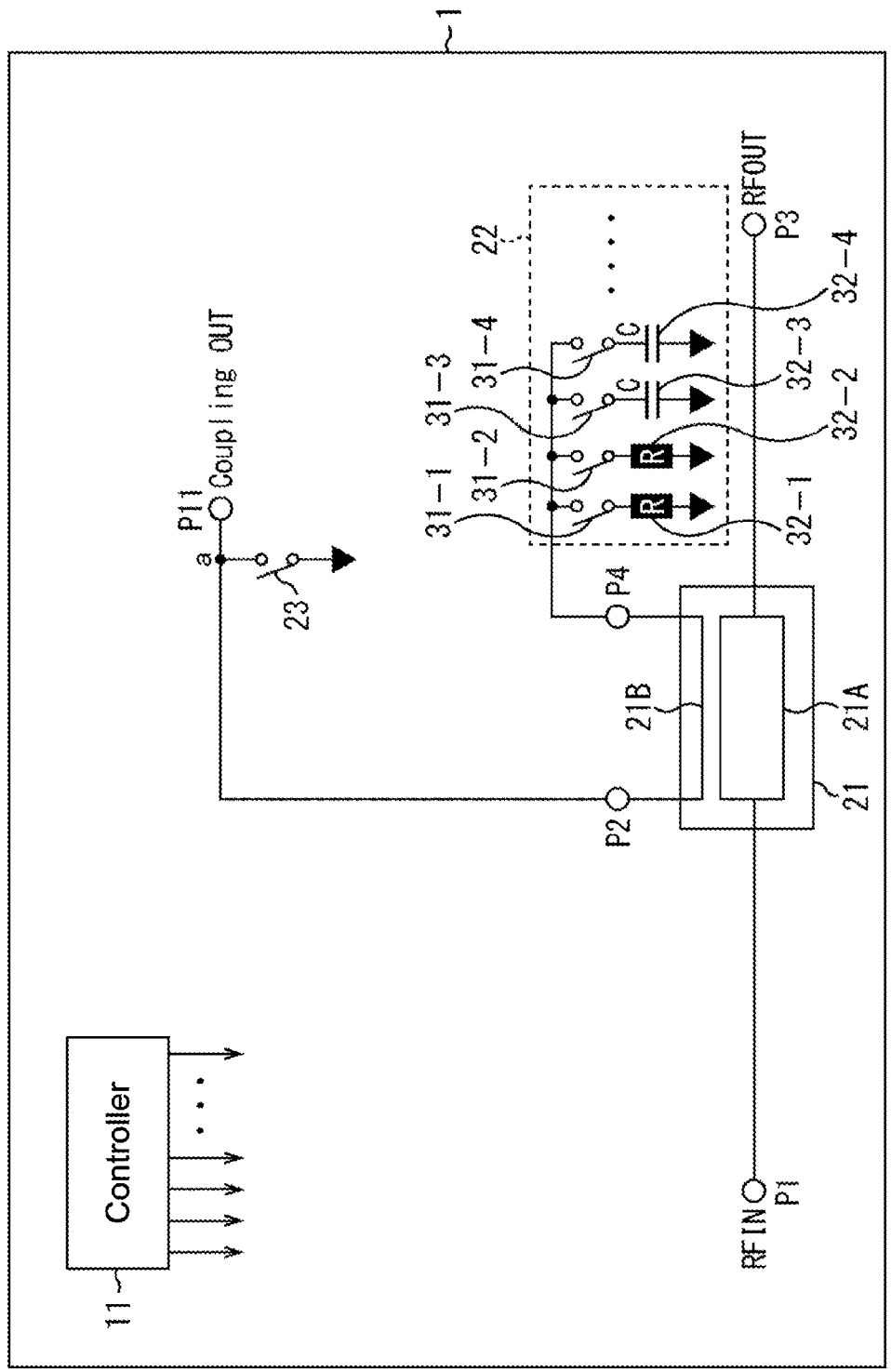
FIG. 1 is a diagram showing a first configuration example of a coupler module.

FIG. 1 is a diagram showing a first configuration example of a coupler module 1 according to an embodiment of the present technology.

The coupler module 1 shown in FIG. 1 is mainly includes a controller 11, a coupler 21, and a termination part 22. The coupler 21 provided in the coupler module 1 shown in FIG. 1 is a single directional coupler that outputs, from a coupling port, a coupling signal corresponding to the traveling wave component of an RF signal.

The coupler module 1 is mounted on a wireless communication apparatus together with other modules. In a module outside the coupler module 1, various kinds of processing are performed on signals output from the coupler module 1.

The controller 11 controls switching (on/off) of switches provided in respective units of the coupler module 1. Information relating to the frequency of an RF signal input to the coupler module 1 and the like are supplied to the controller 11 from an external controller provided in the wireless communication apparatus.

The coupler 21 has a microstrip line 21A that is a main line and a microstrip line 21B that is a sub-line. The microstrip line 21A and the microstrip line 21B constitute a coupled line. The line lengths of the microstrip line 21A and the microstrip line 21B are the same.

The left end of the microstrip line 21A is connected to a port P1 that is an input port of an RF signal, and the right end of the microstrip line 21A is connected to a port P3 that is an output port of the RF signal. For example, an antenna is provided ahead of the port P3.

Meanwhile, both ends of the microstrip line 21B are connected to ports P2 and P4. The port P2 is connected to an output port P11 for a coupling signal, and the port P4 is connected to the ground via the termination part 22.

Figure 2:
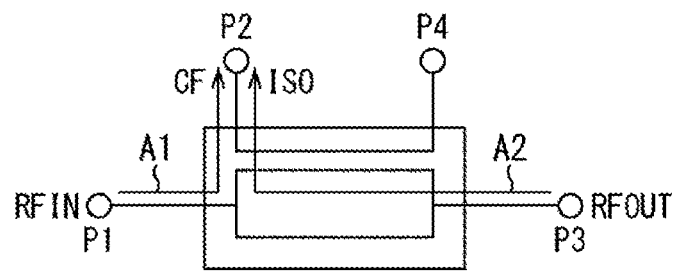
FIG. 2 is a diagram showing the directionality of a coupler.

FIG. 2 is a diagram showing the directionality of the coupler 21.

In the case where an RF signal is input to the port P1, a CF (Coupling Factor) signal, which is a coupling signal corresponding to the traveling wave component of the RF signal, is supplied to the port P2 as indicated by an arrow A1. Further, as indicated by an arrow A2, an ISO (Isolation) signal, which is a coupling signal corresponding to the reflected wave component of the RF signal, is supplied to the port P2.

The difference between the CF signal and the ISO signal is the directivity representing the performance of the coupler 21. The directivity needs to have a certain value or more (dB). The signal supplied to the port P2 is output to the outside from the output port P11, and various kinds of processing are performed on the output signal, in the circuit in the subsequent stage.

A switch 23 connected to the ground is connected to a contact a between the port P2 and the output port P11 shown in FIG. 1.

The termination part 22 connected to the port P4 includes a plurality of passive devices. In FIG. 1, resistors 32-1 and 32-2 and capacitors 32-3 and 32-4 are shown.

The resistor 32-1 is connected to the port P4 via a switch 31-1, and the resistor 32-2 is connected to the port P4 via a switch 31-2. The capacitor 32-3 is connected to the port P4 via a switch 31-3, and the capacitor 32-4 is connected to the port P4 via a switch 31-4. The switches 31-1 to 31-4 are each formed of a FET (Field Effect Transistor), for example. The respective sides of the resistors 32-1 and 32-2 and the capacitors 32-3 and 32-4 opposite to the switches are connected to the ground.

As described above, a plurality of resistors and a plurality of capacitors are connected in parallel to the port P4 via switches. Although only four devices are shown in the example shown in FIG. 1, five or more devices may be provided in the termination part 22.

Figure 3:
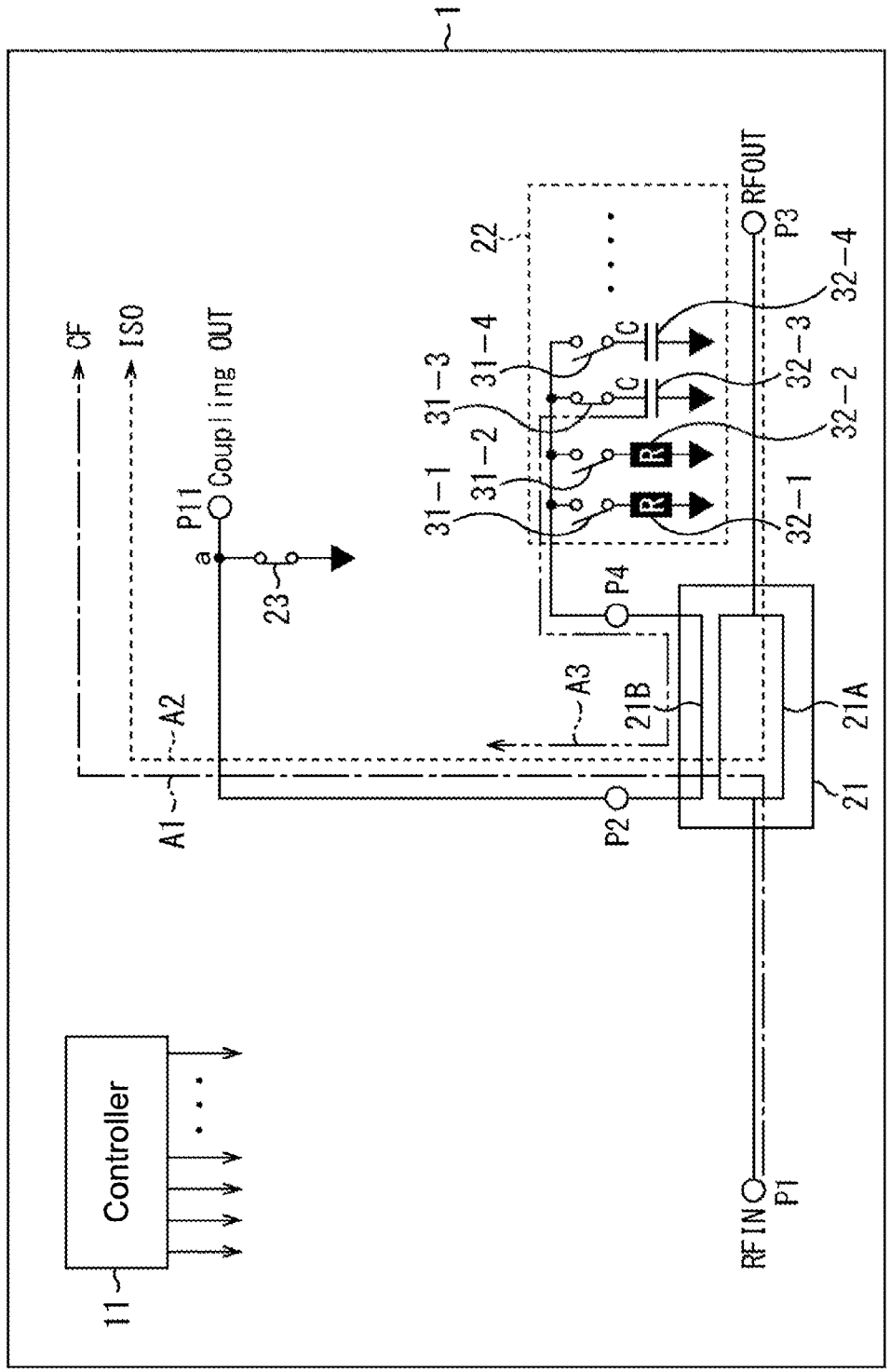
FIG. 3 is a diagram showing an example of the operation of the coupler module.

FIG. 3 is a diagram showing an example of the operation of the coupler module 1.

In the case where an RF signal is input to the port P1, the controller 11 controls the termination part 22 to connect a predetermined device of the termination part 22 to the port P4. As a result, at least one of the termination resistor and the termination capacitor on the port P4 side changes. In the example shown in FIG. 3, the switch 31-3 is turned on and the capacitor 32-3 is connected to the port P4.

Which device of the termination part 22 is to be connected to the port P4 is determined by the frequency of the RF signal. The controller 11 has table information representing combinations of the frequency of the RF signal and the device of the termination part 22 to be connected to the port P4. The table information is stored in a memory in the controller 11, for example.

FIG. 4 is a diagram showing an example of the table information.

In the example shown in FIG. 4, in the case where the frequency of the RF signal is a frequency f1, only a resistor R1 (resistor 32-1) is connected to the port P4. Further, in the case where the frequency of the RF signal is a frequency f2, the resistor R1 and a capacitor C1 (capacitor 32-3) are connected to the port P4. In the case where the frequency of the RF signal is a frequency f3, only a resistor R2 (resistor 32-2) is connected to the port P4. In the case where the frequency of the RF signal is a frequency f4, the resistor R2 and a capacitor C2 (capacitor 32-4) are connected to the port P4.

As described above, the termination condition (the termination resistor and the termination capacitor) of the port P4 is switched depending on the frequency of the RF signal. The termination condition of the port P4 represents that the phase of a return signal of the signal supplied to the port P4 becomes opposite to the phase of an ISO signal in response to the input of the RF signal as indicated by an arrow A3 in FIG. 3.

That is, the controller 11 has in advance information on the termination condition in which the phase of the return signal becomes opposite to the phase of the ISO signal, for each frequency of the RF signal, and causes the termination part 22 to operate on the basis of the information.

As the phase of the return signal becomes opposite to the phase of the ISO signal, the ISO signal is canceled by the return signal.

Figure 5:
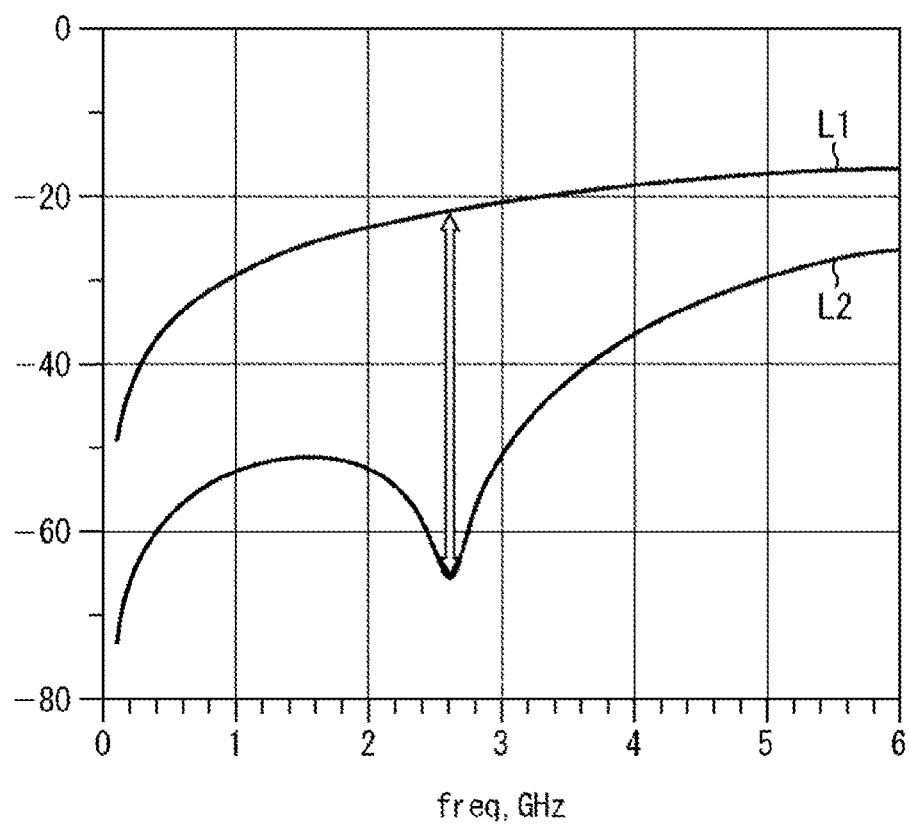
FIG. 5 is a diagram showing an example of characteristics of a CF signal and an ISO signal.

FIG. 5 is a diagram showing an example of characteristics of the CF signal and the ISO signal.

A curve L1 shows the characteristics of the CF signal and a curve L2 shows the characteristics of the ISO signal. The horizontal axis shows the frequency and the vertical axis shows dB.

For example, in the case where the frequency of the RF signal is 2.3 GHz, by optimizing the termination condition and generating an attenuation pole of the ISO signal in the vicinity of 2.3 GHz, it is possible to increase the difference between the CF signal and the ISO signal indicated by an outlined arrow, i.e., directivity. The attenuation pole of the ISO signal is generated by canceling the ISO signal by the return signal.

As described above, by optimizing the termination condition depending on the frequency of the RF signal, it is possible to improve the directivity.

Since the attenuation pole of the ISO signal can be generated at a position of an arbitrary frequency, it is possible to realize a broadband module capable of handling RF signals of various frequencies.

Further, by generating the attenuation pole of the ISO signal at a position of an arbitrary frequency, it is possible to improve the directivity regardless of the line length of the microstrip lines 21A and 21B. That is, it is possible to achieve desired coupler characteristics even with an arbitrary line length without requiring the line length of the wavelength λ/4 generally required for coupler design.

Because it is possible to achieve desired coupler characteristics even in the case where the line lengths of the microstrip lines 21A and 21B are each set to an arbitrary length, e.g., not more than 20 mm, it is possible to achieve miniaturization of the entire coupler module 1.

<1-2. Second Configuration Example of Coupler Module>

Figure 6:
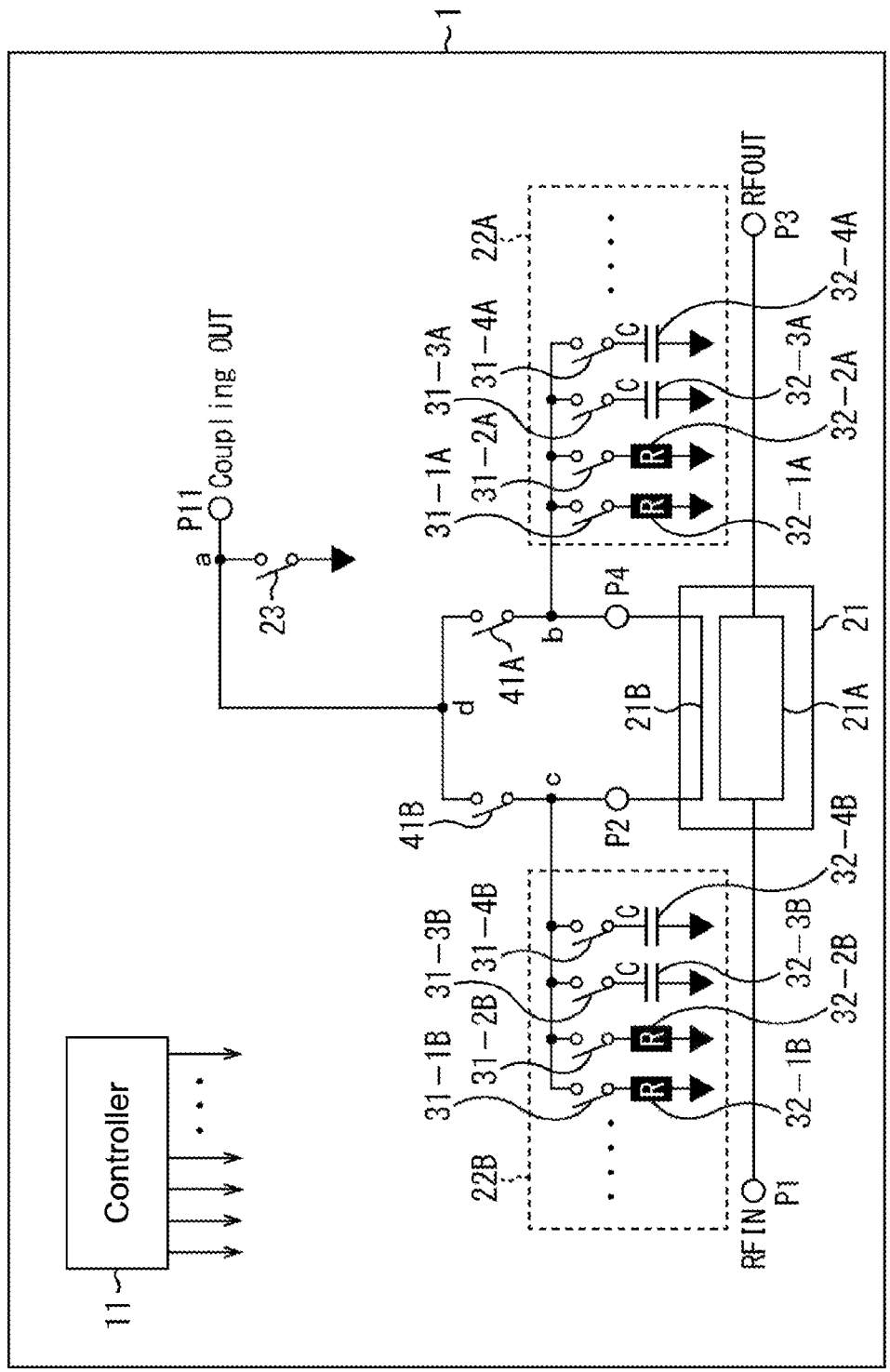
FIG. 6 is a diagram showing a second configuration example of the coupler module.

FIG. 6 is a diagram showing a second configuration example of the coupler module 1.

In the configuration shown in FIG. 6, the same reference symbols are given to the same components as those shown in FIG. 1. Overlapping explanations are omitted as appropriate. The same applies to FIG. 7 and subsequent figures.

The coupler 21 provided in the coupler module 1 shown in FIG. 6 is a dual directional coupler capable of outputting a coupling signal corresponding to the traveling wave component of the RF signal and a coupling signal corresponding to the reflected wave component. In the case of outputting a coupling signal corresponding to the traveling wave component, the CF signal and the ISO signal are supplied to the port P2 (forward (FWD)). Meanwhile, in the case of outputting a coupling signal corresponding to the reflected wave component, the CF signal and the ISO signal are supplied to the port P4 (reverse (REV)).

The port P4 is connected to the output port P11 via a switch 41A. A termination part 22A is connected to a contact b between the port P4 and the switch 41A.

The configuration of the termination part 22A is similar to that of the termination part 22 shown in FIG. 1. A resistor 32-1A is connected to the contact b via a switch 31-1A, and a resistor 32-2A is connected to the contact b via a switch 31-2A. A capacitor 32-3A is connected to the contact b via a switch 31-3A, and a capacitor 32-4A is connected to the contact b via a switch 31-4A. The respective sides of the resistors 32-1A and 32-2A and the capacitors 32-3A and 32-4A opposite to the switches are connected to the ground.

Meanwhile, the port P2 is connected to the output port P11 via a switch 41B. A termination part 22B is connected to a contact c between the port P4 and the switch 41A.

The configuration of the termination part 22B is also similar to that of the termination part 22. A resistor 32-1B is connected to the contact c via a switch 31-1B, and a resistor 32-2B is connected to the contact c via a switch 31-2B. A capacitor 32-3B is connected to the contact c via a switch 31-3B and a capacitor 32-4B is connected to the contact c via a switch 31-4B. The respective sides of the resistors 32-1B and 32-2B and the capacitors 32-3B and 32-4B opposite to the switches are connected to the ground.

Figure 7:
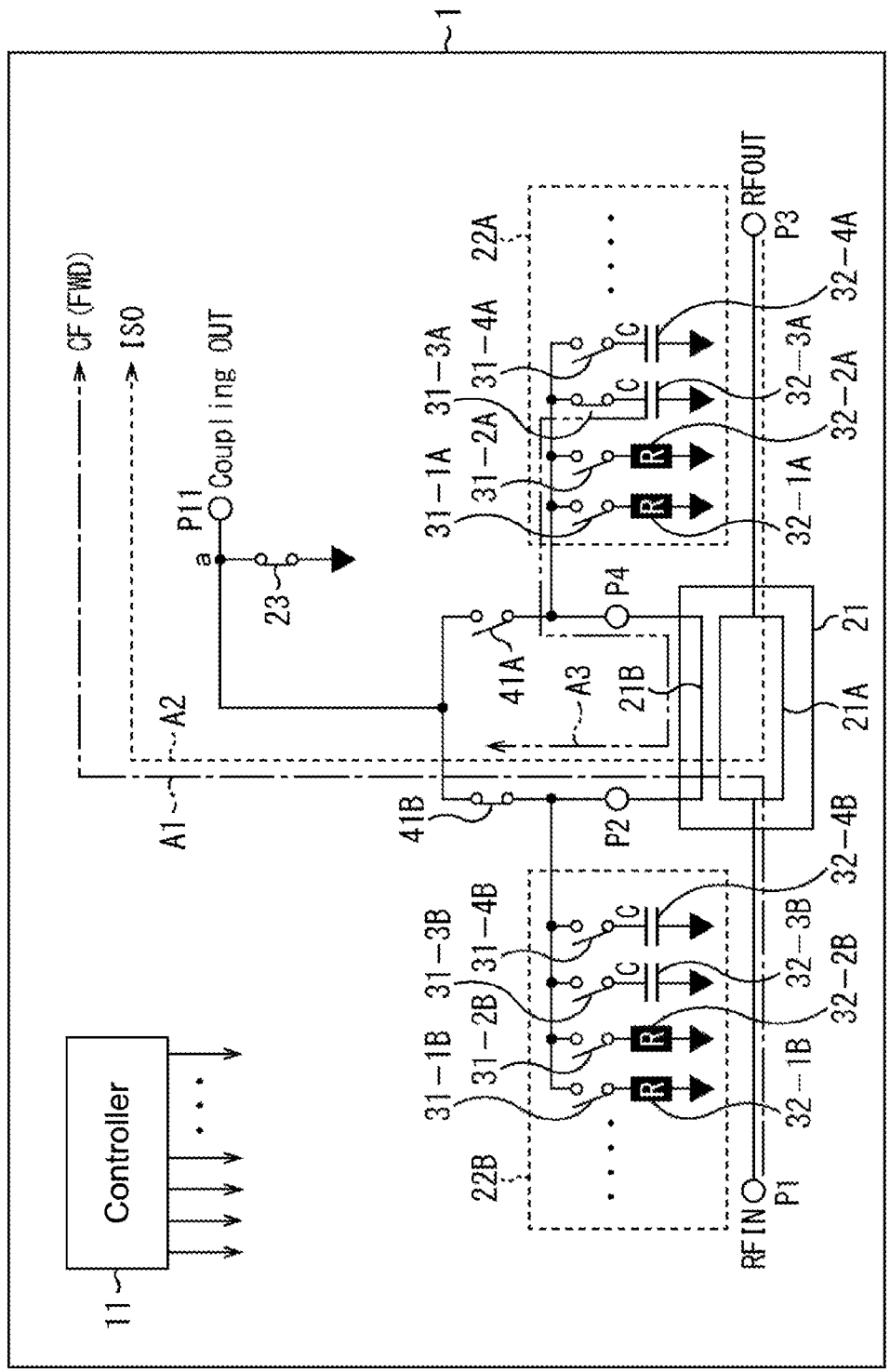
FIG. 7 is a diagram showing an example of the operation of the coupler module shown in FIG. 6.

FIG. 7 is a diagram showing an example of the operation of the coupler module 1 in the case of outputting a coupling signal corresponding to the traveling wave component of the RF signal.

In this case, the controller 11 turns off the switch 41A and turns on the switch 41B. A CF signal, which is a coupling signal corresponding to the traveling wave component of the RF signal, is supplied to the port P2 as indicated by the arrow A1, and an ISO signal, which is a coupling signal corresponding to the reflected wave component, is transmitted to the port P2 as indicated by the arrow A2.

Further, the controller 11 controls the termination part 22A provided on the opposite side to the port P2 as the port to which the coupling signal is to be supplied, and connects a predetermined device of the termination part 22A to the port P4. In the example shown in FIG. 7, the switch 31-3A is turned on and the capacitor 32-3A is connected to the port P4.

The controller 11 has in advance information on the termination condition for each frequency of the RF signal in which the phase of the return signal becomes opposite to the phase of the ISO signal for the case of outputting a coupling signal corresponding to the traveling wave component of the RF signal and the case of outputting a coupling signal corresponding to the reflected wave component. The controller 11 controls the termination part 22A or the termination part 22B on the basis of the information that the controller 11 has in advance.

By switching the termination condition of the port P4 depending on the frequency of the RF signal, the phase of the return signal of the signal supplied to the port P4 in response to the input of the RF signal becomes opposite to the phase of the ISO signal, as indicated by the arrow A3.

As described above, by optimizing the termination condition on the port P4 side depending on the frequency of the RF signal, it is possible to improve the directivity in the case of outputting a coupling signal corresponding to the traveling wave component of the RF signal.

Figure 8:
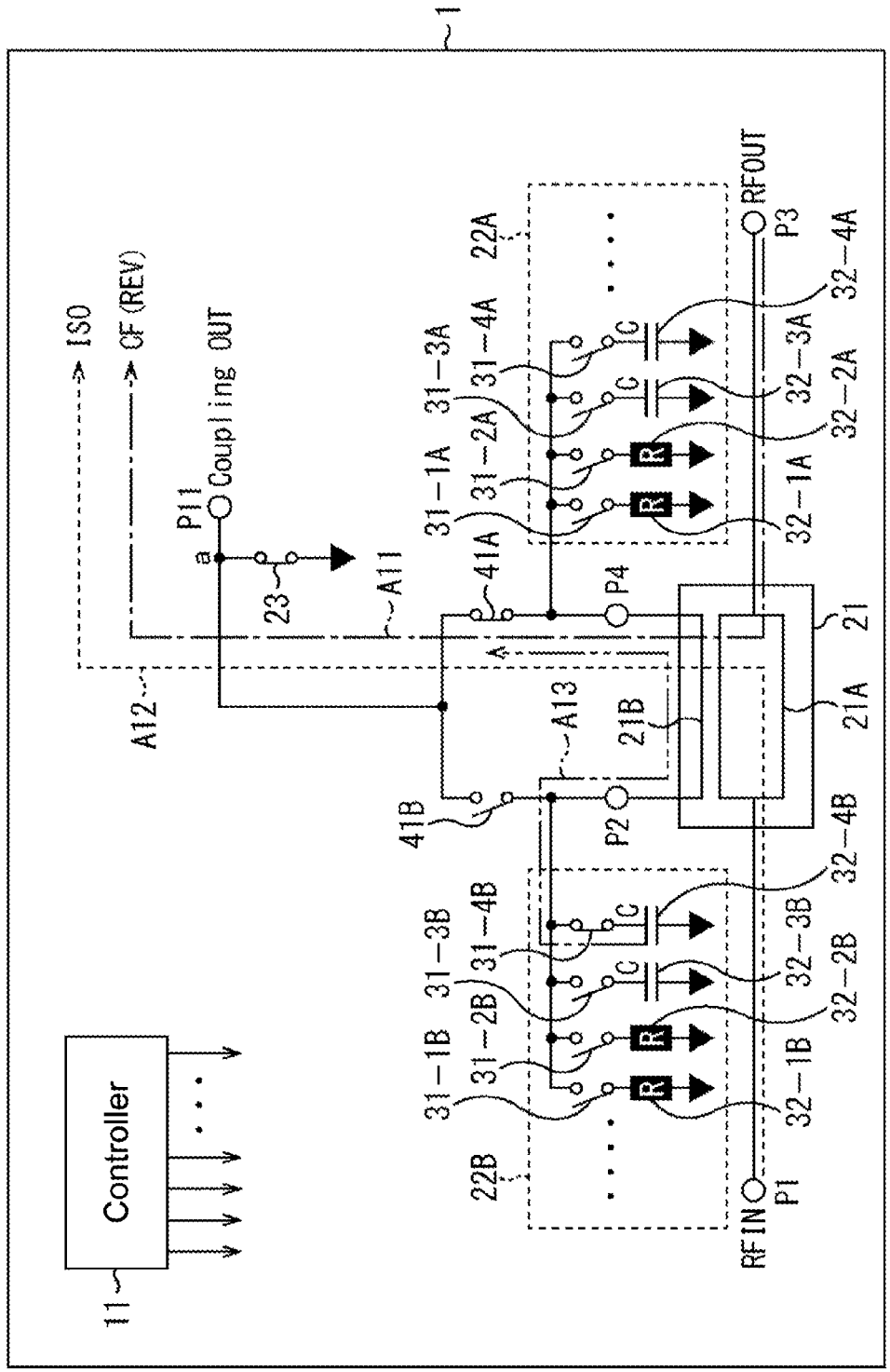
FIG. 8 is a diagram showing another example of the operation of the coupler module shown in FIG. 6.

FIG. 8 is a diagram showing another example of the operation of the coupler module 1 in the case of outputting a coupling signal corresponding to a reflected wave component of an RF signal.

In this case, the controller 11 turns on the switch 41A and turns off the switch 41B. A CF signal, which is a coupling signal corresponding to the reflected wave component of the RF signal, is supplied to the port P4 as indicated by an arrow A11, and an ISO signal, which is a coupling signal corresponding to the traveling wave component, is transmitted to the port P4 as indicated by an arrow A12.

Further, the controller 11 controls the termination part 22B provided on the opposite side to the port P4 as the port to which a coupling signal is to be supplied, and connects a predetermined device of the termination part 22B to the port P2. In the example shown in FIG. 8, the switch 31-4B is turned on and the capacitor 32-4B is connected to the port P2.

By switching the termination condition of the port P2 depending on the frequency of the RF signal, the phase of the return signal of the signal supplied to the port P2 in response to the input of the RF signal becomes opposite to the phase of the ISO signal, as indicated by an arrow A13.

As described above, by optimizing the termination condition on the port P2 side depending on the frequency of the RF signal, it is possible to improve the directivity in the case of outputting a coupling signal corresponding to the reflected wave component of the RF signal.

<1-3. Third Configuration Example of Coupler Module>

Figure 9:
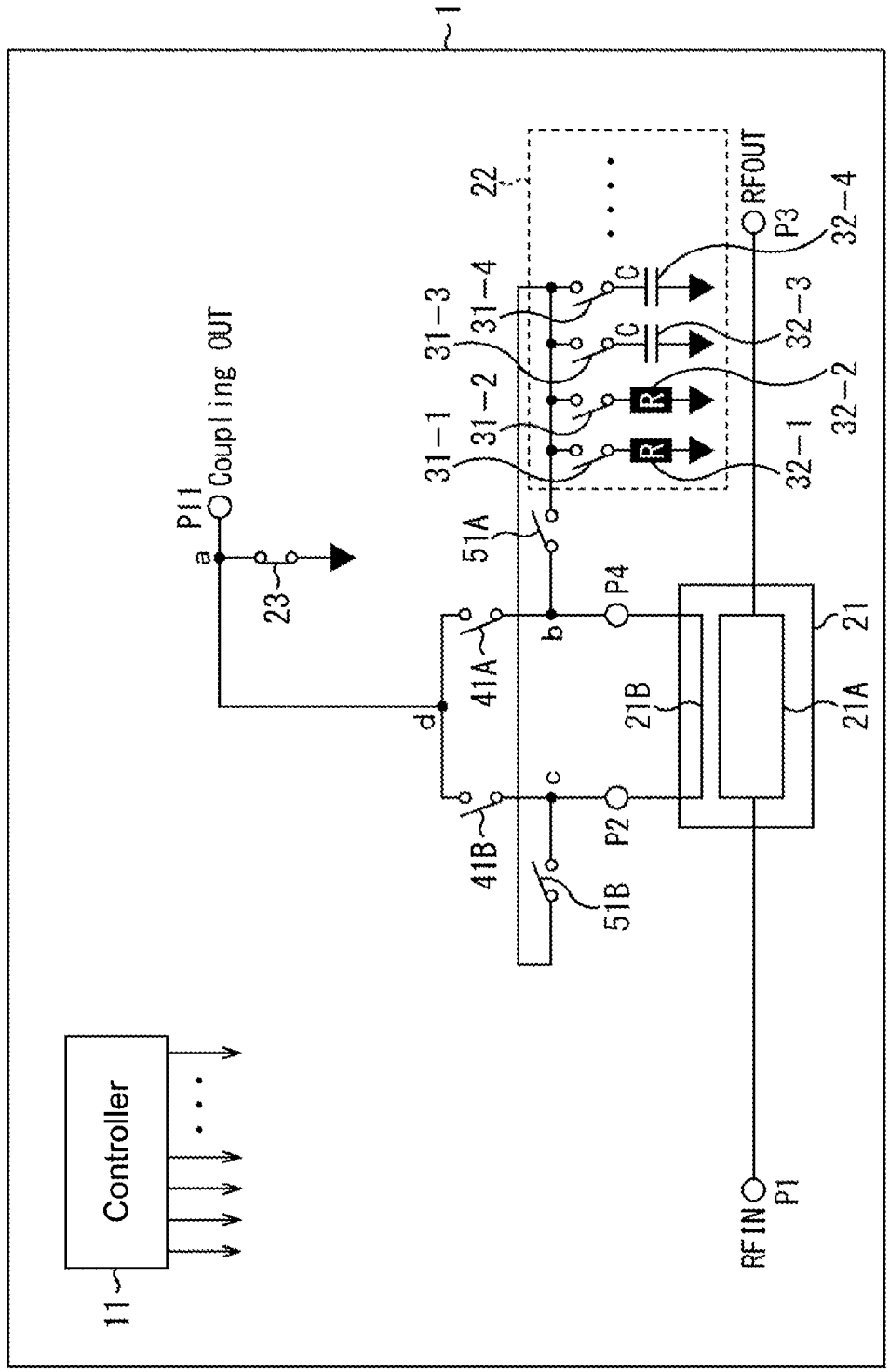
FIG. 9 is a diagram showing a third configuration example of the coupler module.

FIG. 9 is a diagram showing a third configuration example of the coupler module 1.

The coupler 21 provided in the coupler module 1 shown in FIG. 9 is a dual directional coupler. In the coupler module 1 shown in FIG. 9, processing is performed by sharing one termination part for the case of outputting a coupling signal corresponding to the traveling wave component of the RF signal and the case of outputting a coupling signal corresponding to the reflected wave component.

On the port P4 side, a switch 51A is provided between the contact b and the termination part 22. Meanwhile, on the port P2 side, a switch 51B is provided between the port P2 and the termination part 22.

In the case of outputting a coupling signal corresponding to the traveling wave component of the RF signal, the controller 11 turns off the switch 41A and turns on the switch 41B. Further, the controller 11 turns on the switch 51A and turns off the switch 51B. A CF signal, which is a coupling signal corresponding to the traveling wave component of the RF signal, and an ISO signal, which is a coupling signal corresponding to the reflected wave component, are supplied to the port P2.

The controller 11 controls the termination part 22 to switch the termination condition on the port P4 side depending on the frequency of the RF signal. By switching the termination condition of the port P4, the phase of the return signal of the signal supplied to the port P4 becomes opposite to the phase of the ISO signal.

Meanwhile, in the case of outputting a coupling signal corresponding to the reflected wave component of the RF signal, the controller 11 turns on the switch 41A and turns off the switch 41B. Further, the controller 11 turns off the switch 51A and turns on the switch 51B. A CF signal, which is a coupling signal corresponding to the reflected wave component of the RF signal, and an ISO signal, which is a coupling signal corresponding to the traveling wave component, are supplied to the port P4.

The controller 11 controls the termination part 22 to switch the termination condition on the port P2 side depending on the frequency of the RF signal. By switching the termination condition of the port P2, the phase of the return signal of the signal supplied to the port P2 becomes opposite to the phase of the ISO signal.

As described above, by using one termination part in common for the case of outputting a coupling signal corresponding to the traveling wave component of the RF signal and the case of outputting the coupling signal corresponding to the reflected wave component, it is possible to reduce the size of the circuit.

<1-4. Fourth Configuration Example of Coupler Module>

Figure 10:
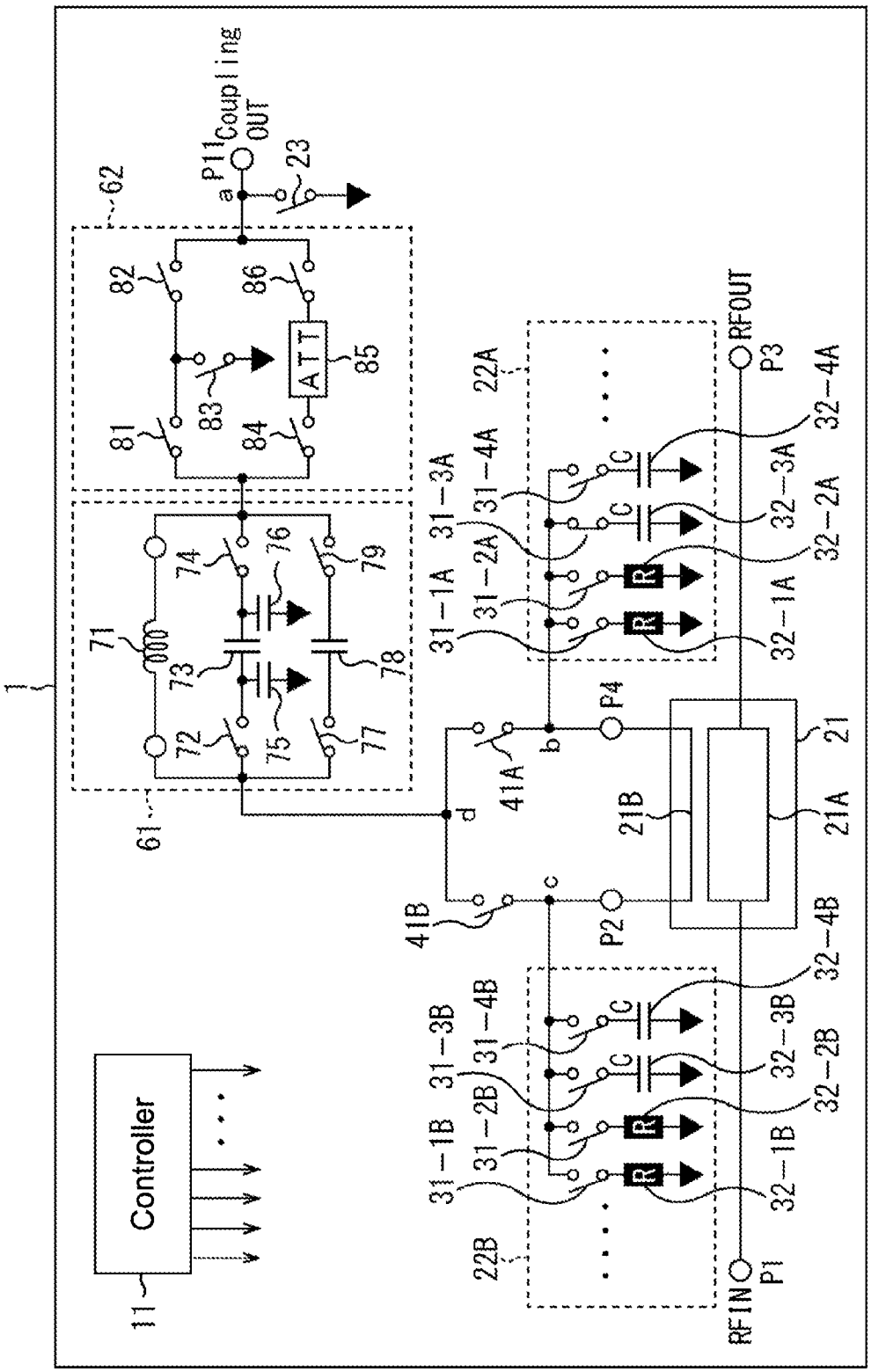
FIG. 10 is a diagram showing a fourth configuration example of the coupler module.

FIG. 10 is a diagram showing a fourth configuration example of the coupler module 1.

The coupler 21 provided in the coupler module 1 shown in FIG. 10 is a dual directional coupler. A filter part 61 and an attenuation part 62 are provided between the output port P11 and a contact d on the output side of the switch 41A and the switch 41B.

The filter part 61 has three paths connected in parallel. An inductor 71 is provided in the upper stage path, and a capacitor 73 is provided between a switch 72 and a switch 74 in the middle stage path. On the input side of the capacitor 73, a capacitor 75 having one electrode connected to the ground is provided. On the output side of the capacitor 73, a capacitor 76 having one electrode connected to the ground is provided. In the lower stage path, a capacitor 78 is provided between a switch 77 and a switch 79.

The attenuation part 62 has two paths connected in parallel. A capacitor 83 connected to the ground is provided between a switch 81 and a switch 82 in the upper stage path. In the lower stage path, an attenuator 85 is provided between a switch 84 and a switch 86.

The controller 11 controls on/off of the switches 41A and 41B and the termination conditions of the ports P2 and P4 as described with reference to FIGS. 6 to 8. Further, the controller 11 controls the impedance of the preceding stage of the output port P11 by switching the paths of the filter part 61 through which the CF signal is transmitted and switching the paths of the attenuation part 62 through which the CF signal is transmitted. As a result, the controller 11 is capable of further optimizing the directivity.

It is also possible to provide the coupler 21 as a single directional coupler and to provide the filter part 61 and the attenuation part 62 between the coupler 21 and the output port P11.

2. Second Embodiment

Next, a coupler module provided with a circuit configuration for equalizing the level (power) of the CF signal in each frequency band will be described.

<2-1. Fifth Configuration Example of Coupler Module>

Figure 11:
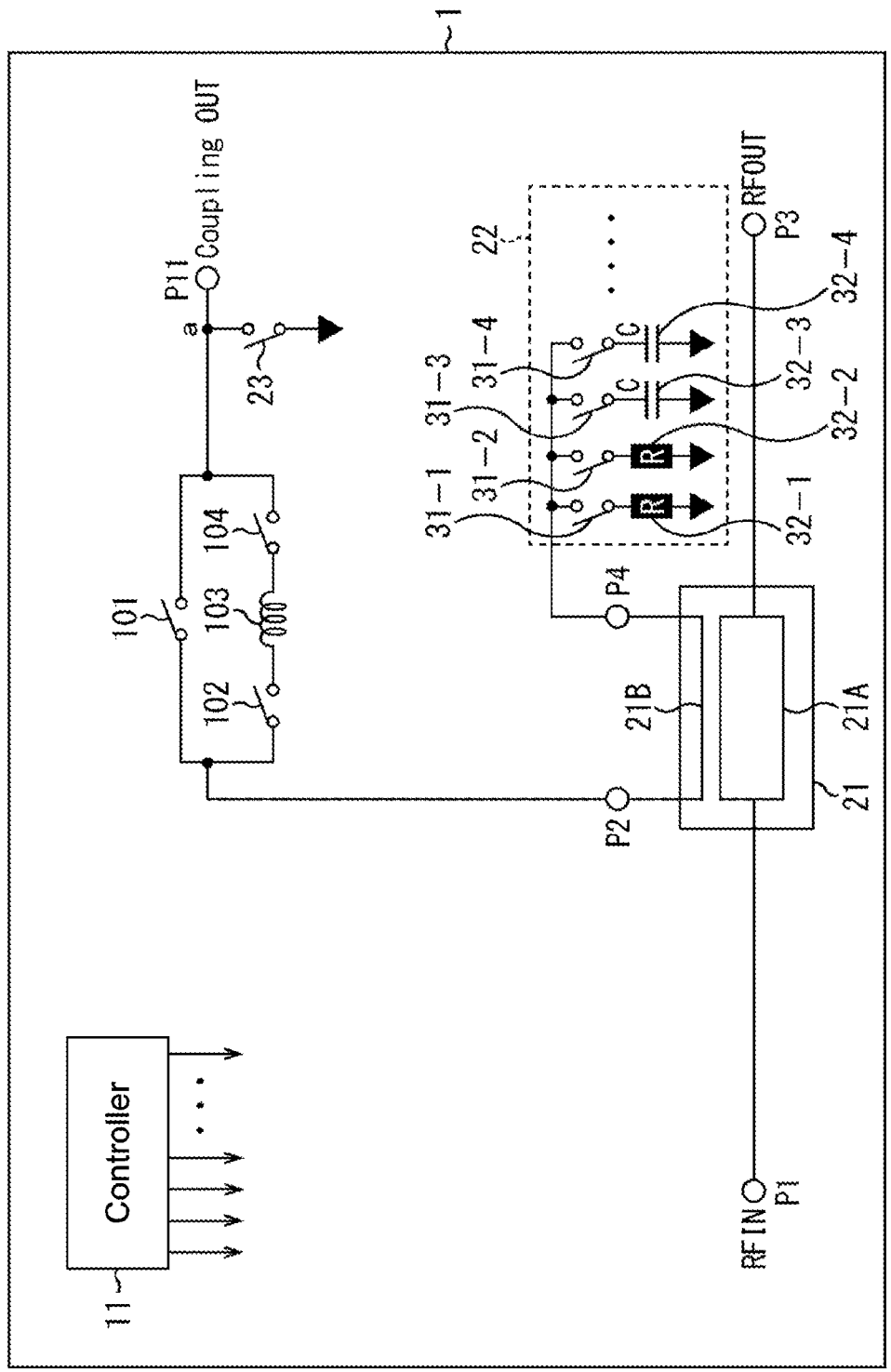
FIG. 11 is a diagram showing a fifth configuration example of the coupler module.

FIG. 11 is a diagram showing a fifth configuration example of the coupler module 1.

The coupler 21 provided in the coupler module 1 shown in FIG. 11 is a single directional coupler. Between the coupler 21 and the output port P11, there are provided an upper stage path provided with a switch 101 and a lower stage path provided with an inductor 103 between a switch 102 and a switch 104.

For example, in the case where the frequency of the CF signal is lower than a threshold value (the CF signal is a low band signal), the controller 11 turns on the switch 101 and turns off the switch 102 and the switch 104. The CF signal is transmitted through the upper stage path bypassing the inductor 103, and output from the output port P11.

Meanwhile, in the case where the frequency of the CF signal is higher than the threshold value (the CF signal is a high band signal), the controller 11 turns off the switch 101 and turns on the switch 102 and the switch 104. The CF signal is transmitted through the lower stage path to which the inductor 103 is connected in series, and output from the output port P11.

By using a path to which an inductor is connected in series as a transmission path of the CF signal, it is possible to reduce the level of the high band CF signal to close to the level of the low band CF signal.

By providing a plurality of paths having different loads and switching the transmission path depending on the frequency of the CF signal, it is possible to equalize the level of the CF signal in each frequency band.

Figure 12:
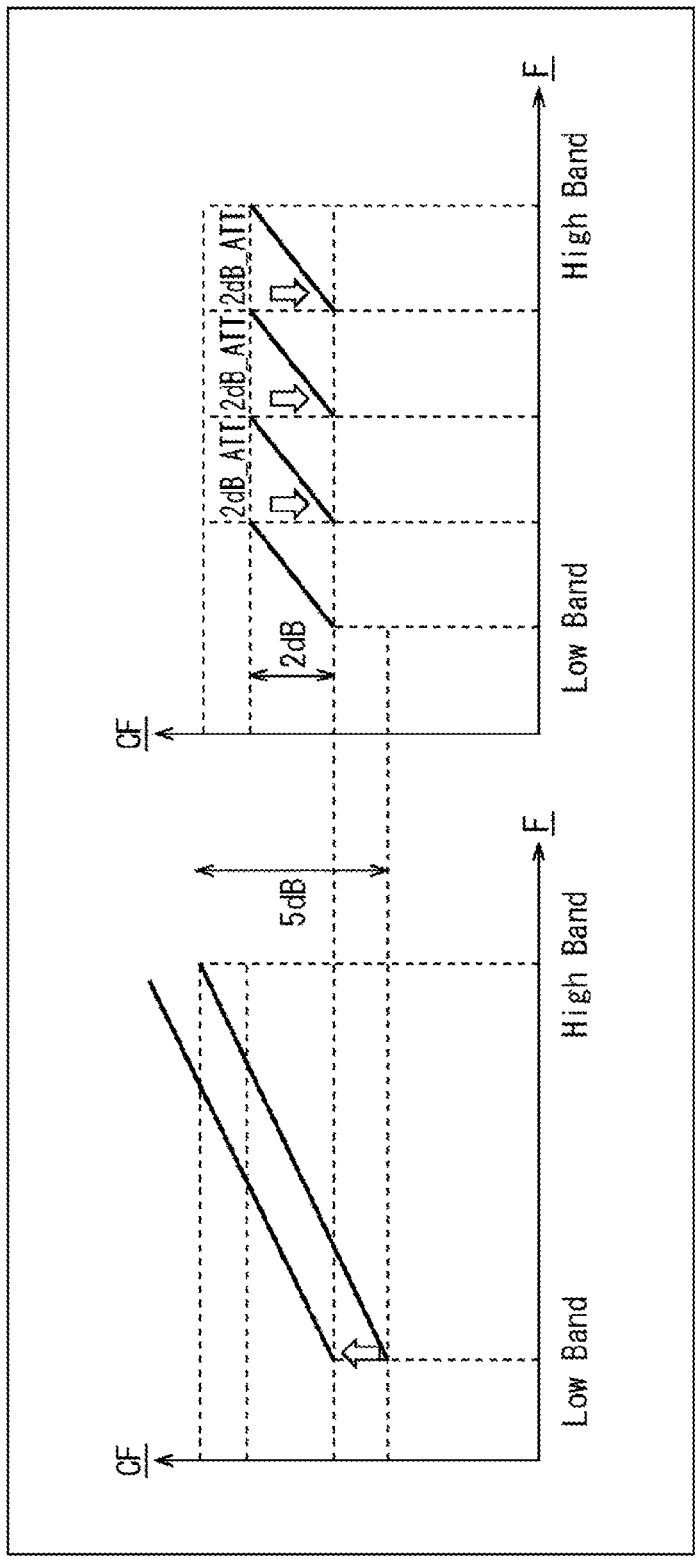
FIG. 12 is a diagram showing an example of level equalization of the CF signal.

FIG. 12 is a diagram showing an example of level equalization of the CF signal.

In the case where the level of the CF signal is raised as indicated by an outlined arrow on the graph on the left side by, for example, adjusting the characteristics of the coupler 21, the level of the CF signal rises over the entire frequency band. The coupling degree of the coupler 21 is higher as the frequency of the RF signal is higher. Therefore, the higher the frequency of the RF signal is, the higher the level of the CF signal is.

As shown in the graph on the right side of FIG. 12, by lowering the level of the CF signal for each frequency band by, for example, switching the path, it is possible to achieve level equalization of the CF signal. In the case of the example shown in FIG. 12, although there is a difference of 5 dB between the low band CF signal and the high band CF signal, it is adjusted so as to be within a difference of 2 dB.

As described above, the level equalization of the CF signal may make signal processing in a circuit provided at the subsequent stage of the coupler module 1 easy.

<2-2. Sixth Configuration Example of Coupler Module>

Figure 13:
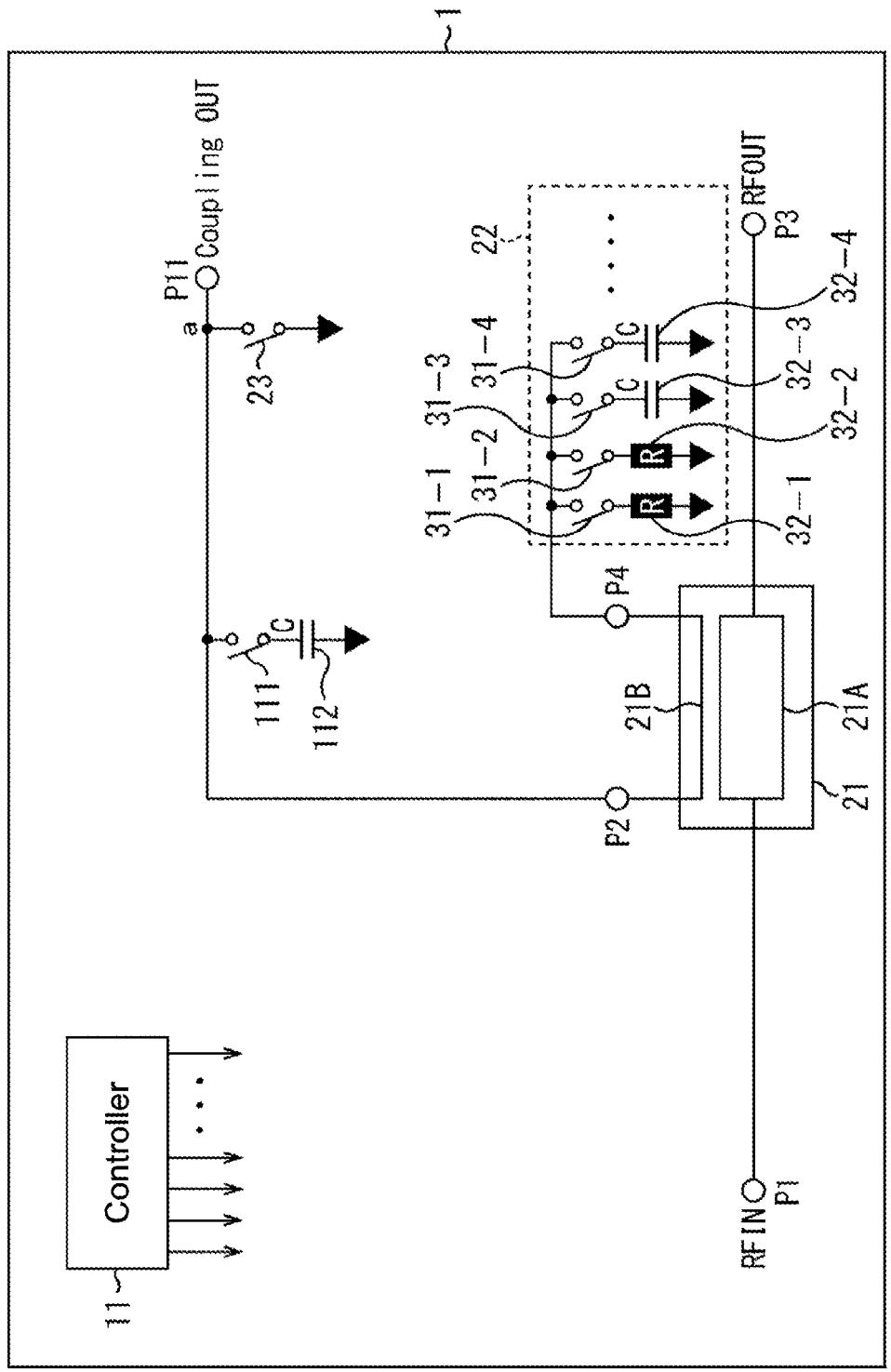
FIG. 13 is a diagram showing a sixth configuration example of the coupler module.

FIG. 13 is a diagram showing a sixth configuration example of the coupler module 1.

Between the coupler 21 of the coupler module 1 and the output port P11 shown in FIG. 13, a capacitor 112 having one electrode connected to the ground is provided in parallel via a switch 111. The other configuration is similar to the configuration shown in FIG. 11.

For example, in the case where the frequency of the CF signal is lower than a threshold value, the controller 11 turns off the switch 111. Meanwhile, in the case where the frequency of the CF signal is higher than the threshold value, the controller 11 turns on the switch 111.

Also by providing a capacitor in parallel as shown in FIG. 13, it is possible to equalize the level of the CF signal for each frequency band.

<2-3. Seventh Configuration Example of Coupler Module>

Figure 14:
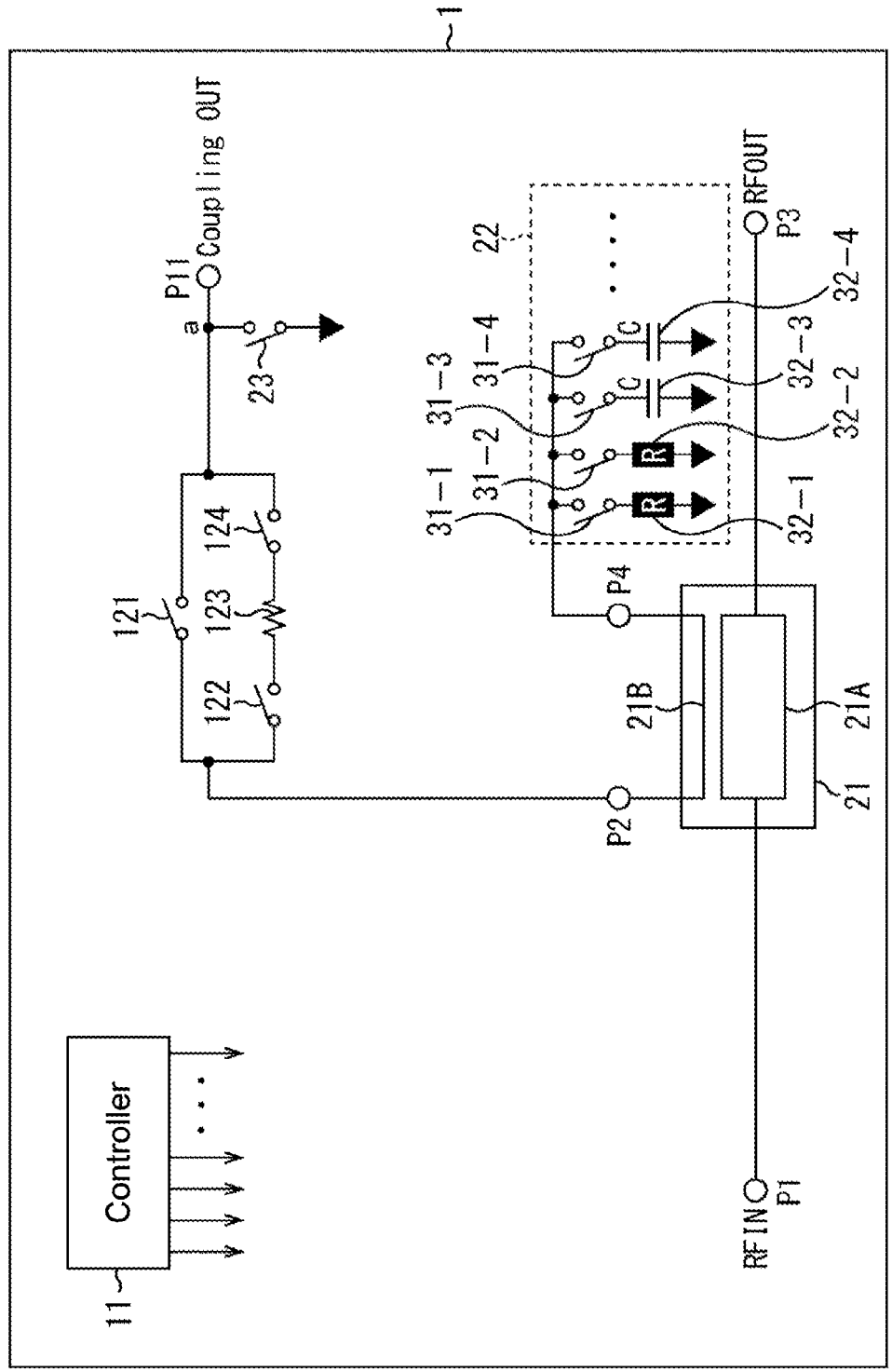
FIG. 14 is a diagram showing a seventh configuration example of the coupler module.

FIG. 14 is a diagram showing a seventh configuration example of the coupler module 1.

The configuration of the coupler module 1 shown in FIG. 14 is different from the configuration shown in FIG. 11 in that a resistor 123 is provided instead of the inductor 103.

That is, between the coupler 21 and the output port P11, there are provided an upper stage path provided with a switch 121 and a lower stage path provided with the resistor 123 between a switch 122 and a switch 124.

For example, in the case where the frequency of the CF signal is lower than a threshold value, the controller 11 turns on the switch 121 and turns off the switch 122 and the switch 124. The CF signal is transmitted through the upper stage path bypassing the resistor 123, and output from the output port P11.

Meanwhile, in the case where the frequency of the CF signal is higher than the threshold value, the controller 11 turns off the switch 121 and turns on the switch 122 and the switch 124. The CF signal is transmitted through the lower stage path to which the resistor 123 is connected in series, and output from the output port P11.

By using the path to which the resistor 123 is connected in series as the transmission path of the CF signal, it is possible to lower the level of the high band CF signal to close to the level of the low band CF signal.

In the examples shown in FIGS. 11, 13, and 14, although the coupler 21 provided in the coupler module 1 is a single directional coupler, the coupler 21 may be a dual directional coupler.

Figure 15:
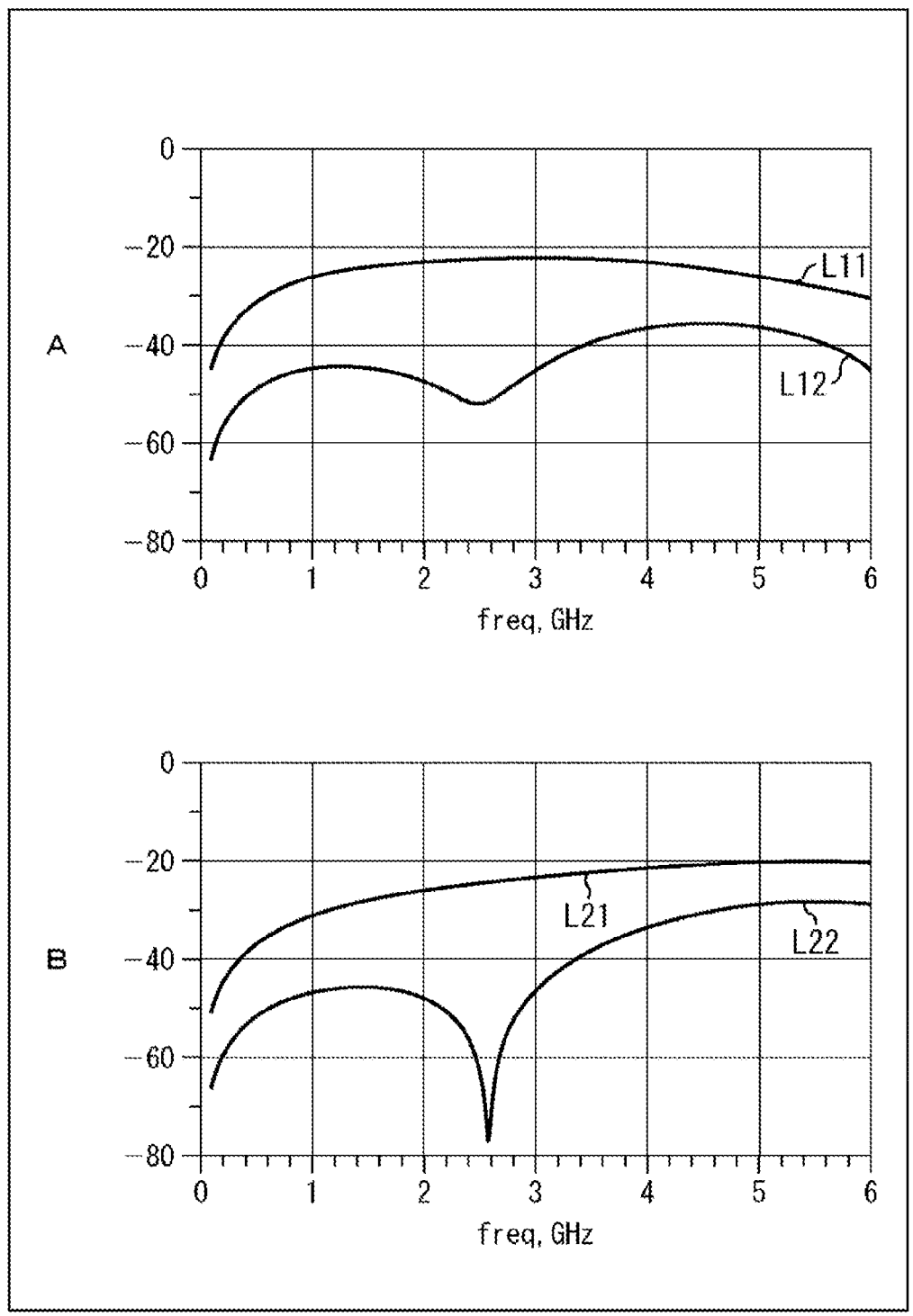
FIG. 15 is a diagram showing characteristics of the CF signal and an ISO signal.

FIG. 15 is a diagram showing an example of characteristics of the CF signal and the ISO signal whose levels are equalized.

Part A of FIG. 15 is a diagram showing the characteristics in the case where the configuration shown in FIG. 13 in which a capacitor is provided in parallel at the front stage of the output port P11 is employed. A curve L11 shows the characteristics of the CF signal and a curve L12 shows the characteristics of the ISO signal. The difference between the levels of the high band side and the low band side in the level of the CF signal shown by the curve L11 is smaller than that in the level of the CF signal shown by the curve L1 shown in FIG. 5.

Part B of FIG. 15 is a diagram showing the characteristics in the case where the configuration shown in FIG. 14 in which a resistor is provided in series at the front stage of the output port P11 is employed. A curve L21 shows the characteristics of the CF signal and a curve L22 shows the characteristics of the ISO signal. Also the difference between the levels of the high band side and the low band side in the level of the CF signal shown by the curve L21 is smaller than that in the level of the CF signal shown by the curve L1 shown in FIG. 5.

<2-4. Eighth Configuration Example of Coupler Module>

Figure 16:
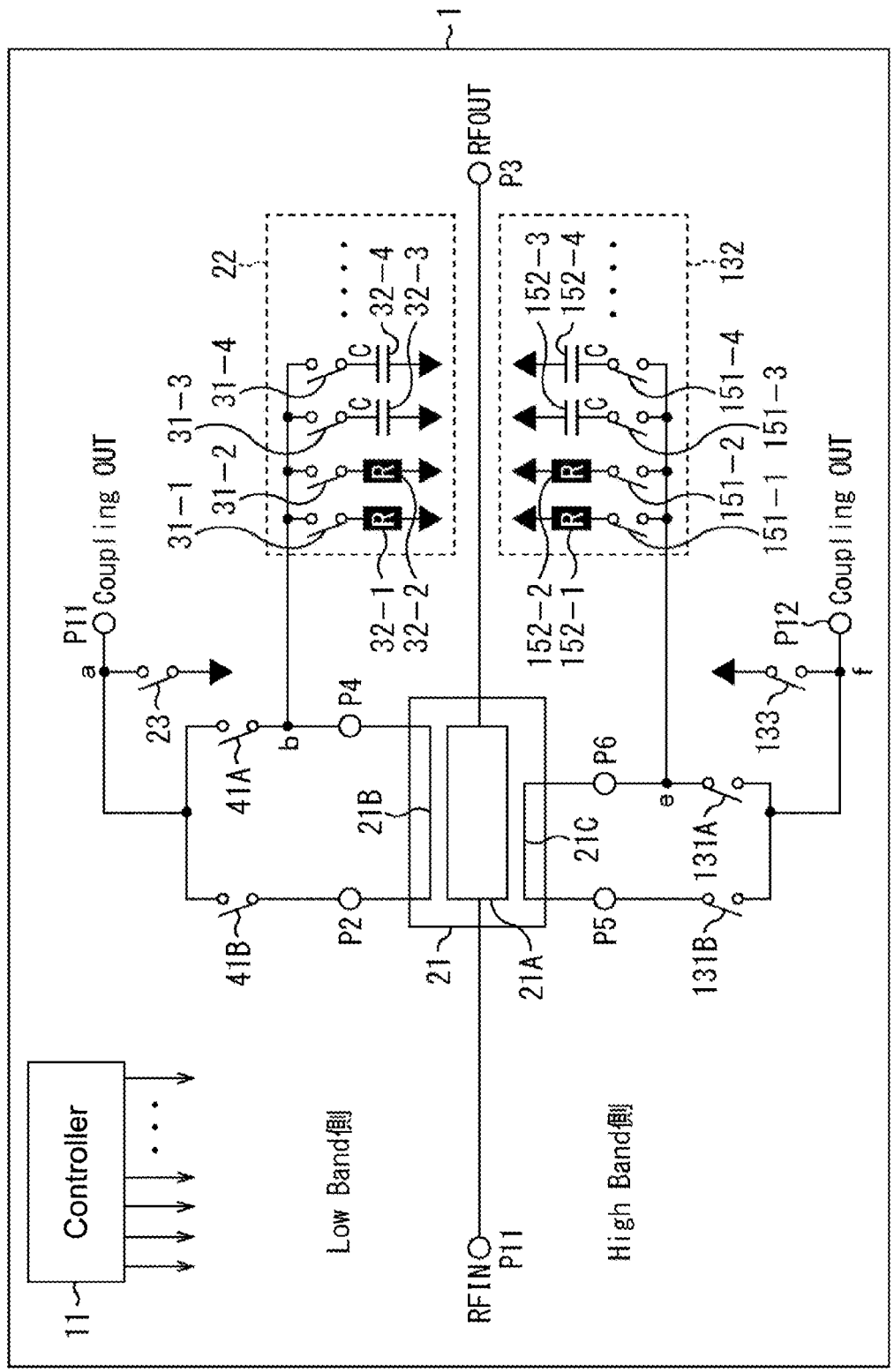
FIG. 16 is a diagram showing an eighth configuration example of the coupler module.

FIG. 16 is a diagram showing an eighth configuration example of the coupler module 1.

The coupler module 1 shown in FIG. 16 adjusts the level of the CF signal without using passive devices.

The configuration on the upper side of FIG. 16 connected to the port P2 and the port P4 of the microstrip line 21B is the same as the configuration described with reference to FIG. 1 except that the switch 41A is provided on the port P4 side and the switch 41B is provided on the port P2 side. In the example shown in FIG. 16, the same configuration as the upper configuration is provided on the lower side with the coupler 21 disposed therebetween.

The coupler 21 is provided with a microstrip line 21C in addition to the microstrip line 21B, as a sub-line with the microstrip line 21A as a main line. The microstrip line 21A and the microstrip line 21C also constitute a coupled line. The line length of the microstrip line 21C is shorter than the line length of the microstrip line 21A.

As described above, the coupling degree of the coupler 21 is higher as the frequency of the RF signal is higher. In the case where assumption is made that the line length of the main line and the line length of the sub-line are fixed, the higher the frequency of the RF signal is, the higher the level of the CF signal is. Meanwhile, in the case where assumption is made that the frequency of the RF signal is fixed, the level of the CF signal flowing through the sub-line having the same line length as that of the main line is higher than the level of the CF signal flowing through the sub-line having a line length shorter than the main line.

The coupler module 1 shown in FIG. 16 adjusts the level of the CF signal by switching the configuration used for signal processing depending on the frequency of the RF signal. That is, the configuration on the upper side connected to the microstrip line 21B having the same line length as that of the microstrip line 21A is used in the case where the RF signal is a low band signal. The configuration on the lower side connected to the microstrip line 21C having a line length shorter than that of the microstrip line 21A is used when the RF signal is a high band signal.

Ports P5 and P6 are connected to both ends of the microstrip line 21C. The port P5 is connected to an output port P12 via a switch 131B, and the port P6 is connected to an output port P12 via a switch 131A. The output port P11 and the output port P12 may be the same port.

A termination part 132 is connected to a contact e between the port P6 and the switch 131A. The configuration of the termination part 132 is also similar to that of the termination part 22 shown in FIG. 1, for example. A resistor 152-1 is connected to the contact e via a switch 151-1, and a resistor 152-2 is connected to the contact e via a switch 151-2. A capacitor 152-3 is connected to the contact e via a switch 151-3, and a capacitor 152-4 is connected to the contact e via a switch 151-4. The respective sides of the resistors 152-1 and 152-2 and the capacitors 152-3 and 152-4 opposite to the switches are connected to the ground.

A switch 133 having one electrode connected to the ground is connected to a contact f on the path between the ports P5 and P6 and the output port P12.

For example, in the case where the frequency of the CF signal is lower than a threshold value, the controller 11 turns off the upper switch 41A, turns on the upper switch 41B, and turns off the lower switches 131A and 131B. The controller 11 switches the termination condition of the port P4 by controlling the termination part 22, and outputs a low band CF signal.

Meanwhile, in the case where the frequency of the CF signal is higher than the threshold value, the controller 11 turns off the upper switches 41A and 41B, turns off the lower switch 131A, and turns on the lower switch 131B. The controller 11 switches the termination condition of the port P6 by controlling the termination part 132, and outputs a high band CF signal.

Accordingly, even in the case where the frequency of the RF signal is high, it is possible to output, from the output port P12, a CF signal having a level close to the CF signal output from the output port P11 when the frequency of the RF signal is low. In the case where the level of the CF signal is adjusted by using a device, although the loss between the port P1 and the port P3 becomes large, it is possible to suppress such loss.

The coupler 21 shown in FIG. 16 can also be a dual directional coupler.

3. Others

Figure 17:
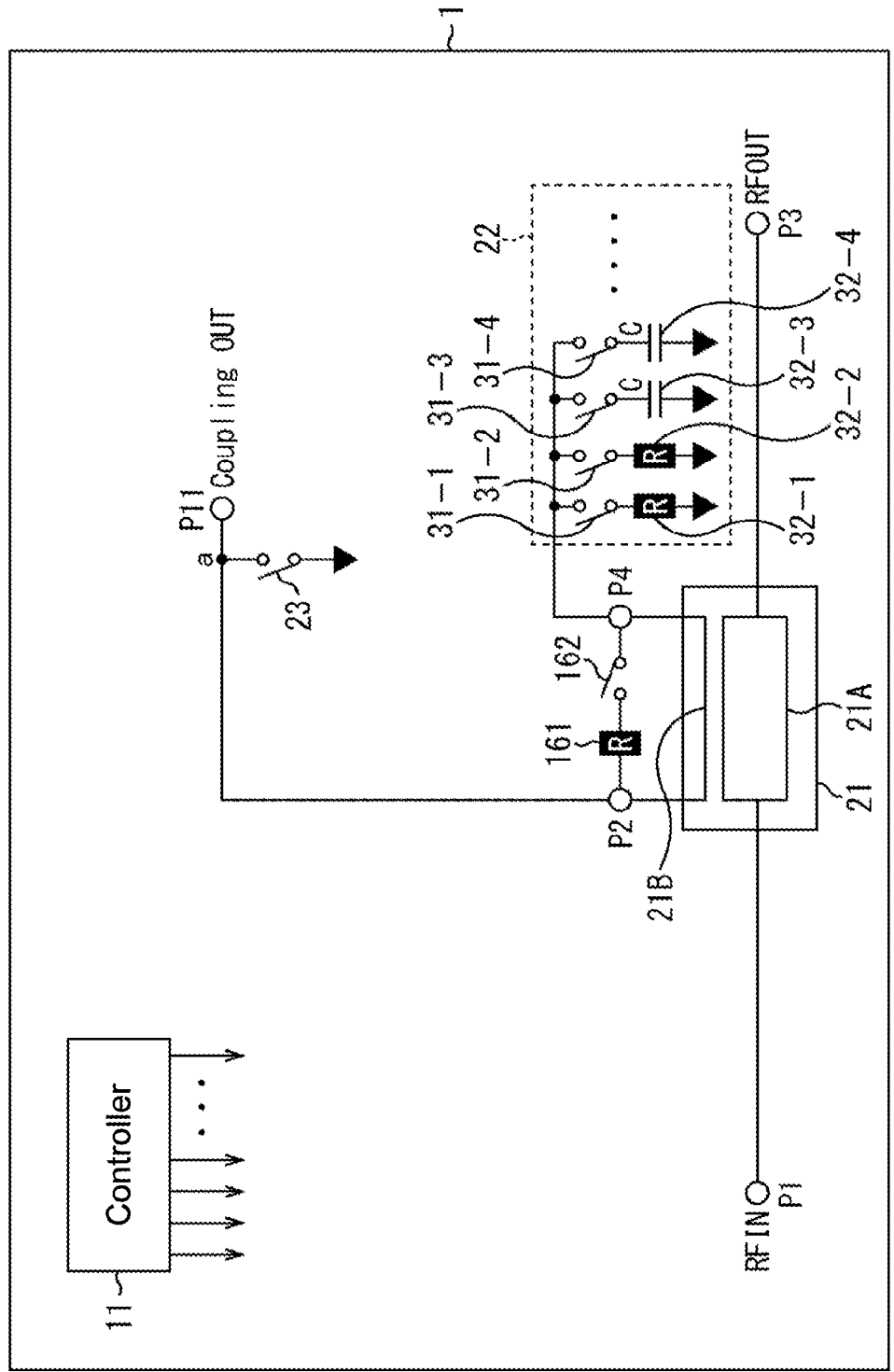
FIG. 17 is a diagram showing a ninth configuration example of the coupler module.

FIG. 17 is a diagram showing an eighth configuration example of the coupler module 1.

As shown in FIG. 17, it is also possible to provide a resistor 161 and a switch 162 connected in series between the port P2 and the port P4 of the coupler 21. By switching on/off of the switch 162, the controller 11 is capable of further adjusting the termination condition by the amount corresponding to the resistor 161.

<3-1. Configuration Example of Switch>

Figure 18:
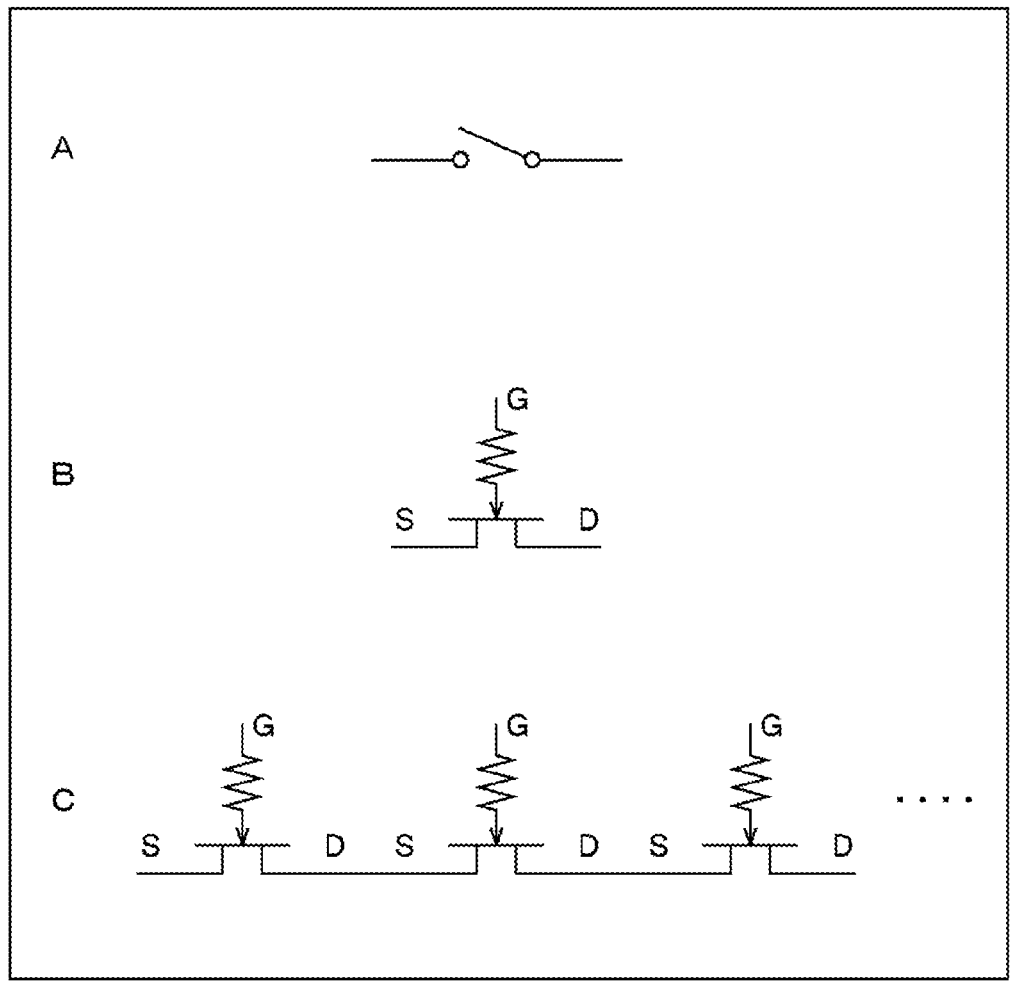
FIG. 18 is a circuit diagram showing a configuration example of a switch.

FIG. 18 is a circuit diagram showing a configuration example of a switch.

Although each switch provided in the coupler module 1 is a simple switch shown in Part A of FIG. 18 in the above description, it is also possible to employ the configuration shown in Part B of FIG. 18. The switch shown in Part B of FIG. 18 has a configuration in which a resistor is connected to a gate terminal of a FET.

It is also possible to connect a plurality of switches shown in Part B of FIG. 18 in series as shown in Part C of FIG. 18. Increasing the number of stages of the switch makes it possible to enhance the resistance to electrostatic discharge (ESD: Electro Static Discharge). The configuration shown in Part C of FIG. 18 can be used for any of the switch connected in series and the switch connected in shunt.

Figure 19:
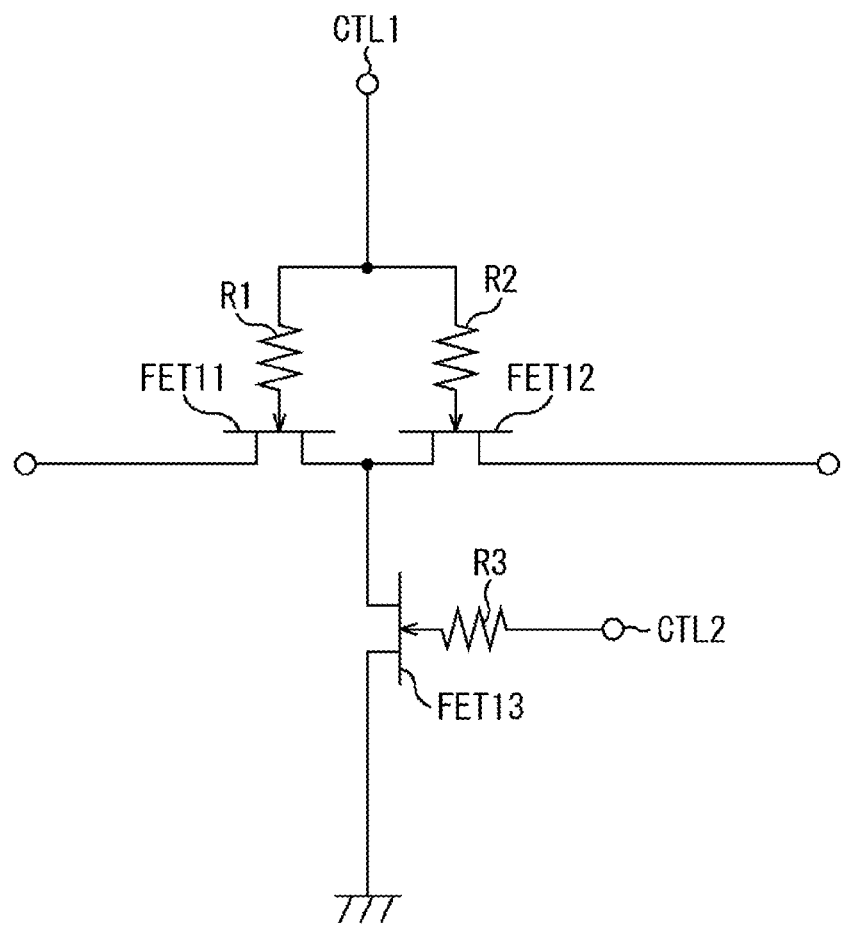
FIG. 19 is another circuit diagram showing a configuration example of the switch.

FIG. 19 is another circuit diagram showing a configuration example of the switch.

Each of the above-described switches can be realized by a circuit configuration as shown in FIG. 19.

The switch circuit shown in FIG. 19 has a structure in which two FETs 11 and 12 are connected in series to a signal path (signal input terminal to signal output terminal) and a FET 13 is connected in shunt from a connection midpoint between the FET 11 and the FET 12. The FET 11 and the FET 12 are simultaneously turned on or off by control voltage applied to a control terminal CTL1. The FET 13 is turned on or off complementarily to the FET 11 and the FET 12 by control voltage applied to a control terminal CTL 2.

Figure 20:
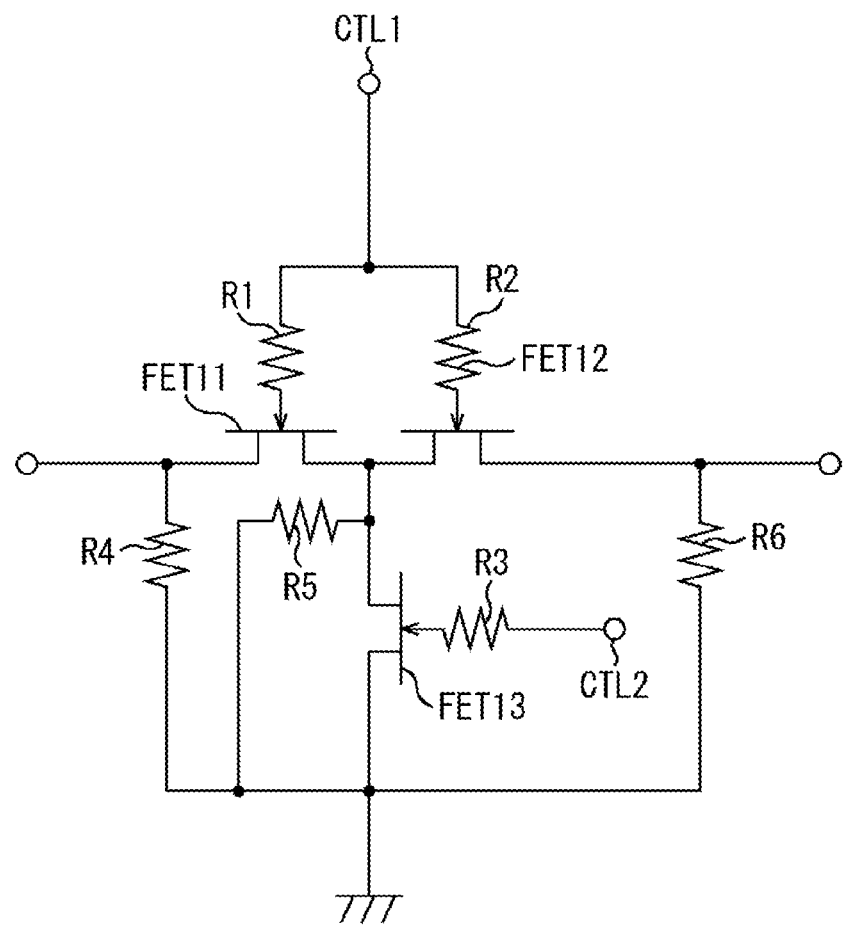
FIG. 20 is still another circuit diagram showing a configuration example of the switch.

FIG. 20 is still another circuit diagram showing a configuration example of the switch. In the configuration shown in FIG. 20, the same reference symbols are given to the same components as those shown in FIG. 19.

In the example shown in FIG. 20, a resistor R4 is provided between a source terminal of the FET 11 and a ground GND, and a resistor R5 is provided between a drain terminal of the FET 11 and the ground GND. Further, the resistor R5 is provided between a source terminal of the FET 12 and the ground GND, and the resistor R6 is provided between a drain terminal of the FET 12 and the ground GND. The resistors R4, R5, and R6 are resistors for biasing. By keeping the drain region and the source region of each FET at the same potential as the ground GND, there is no need to externally apply bias to the drain region and the source region, and the mounting area can be reduced.

It is also possible to mount each switch in the form of an SOI (Silicon On Insulator) in which a silicon layer is formed on an insulating layer.

<3-2. Module Structure>

Figure 21:
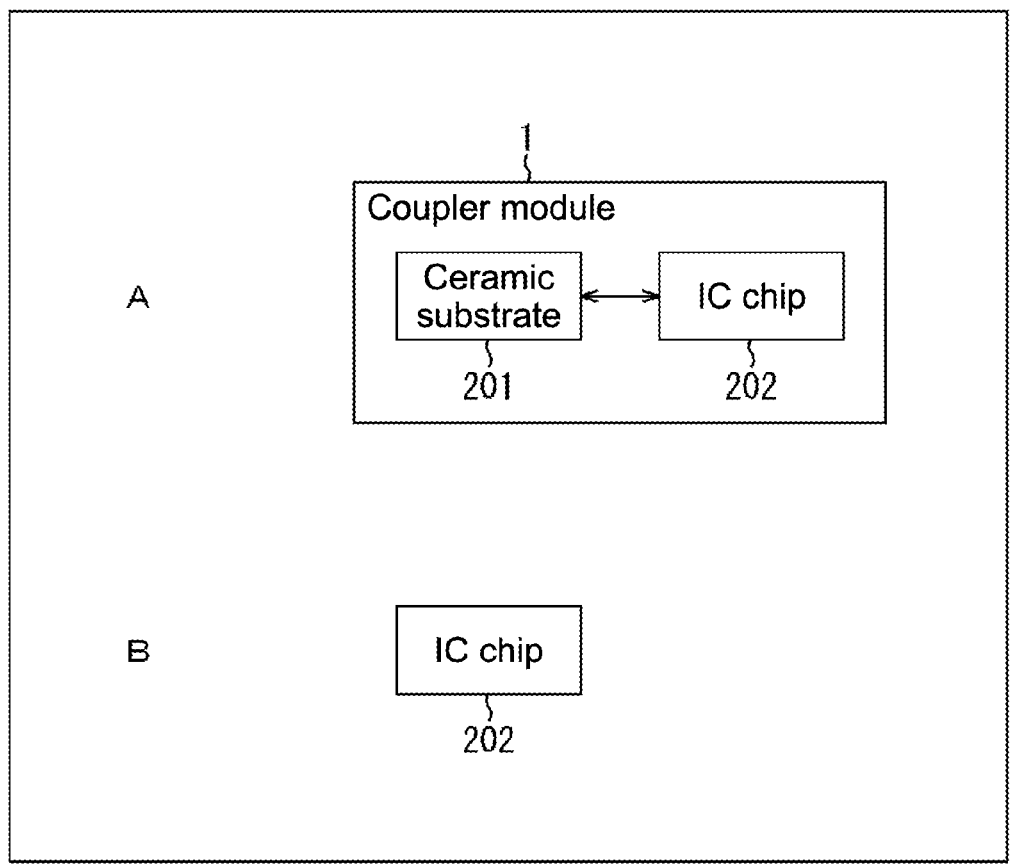
FIG. 21 is a diagram showing an example of a structure of the coupler module.

FIG. 21 is a diagram showing an example of the structure of the coupler module 1.

It is possible not only to mount the configuration of the coupler module 1 shown in FIG. 1 and the like on a single substrate but also to divide it into a ceramic substrate 201 and an IC chip 202 and mount the ceramic substrate 201 and the IC chip 202 as shown in Part A of FIG. 21. The IC chip 202 is formed by disposing various devices on a silicon substrate.

For example, in the configuration shown in FIG. 1, the coupler 21 is mounted on the ceramic substrate 201, and the termination part 22 is mounted on the ceramic substrate 201. The combination of the configuration mounted on the ceramic substrate 201 and the configuration mounted on the IC chip 202 can be arbitrarily set. For example, the coupler module 1 is obtained by laminating and arranging the IC chip 202 on the ceramic substrate 201.

Further, it is also possible to mount all the configurations of the coupler module 1 on the IC chip 202 as shown in Part B of FIG. 21.

By providing a coupler, each switch, a termination part, and the like in the IC chip 202, it is possible to reduce the number of parts.

<3-3. Example of Communication Apparatus>

Figure 22:
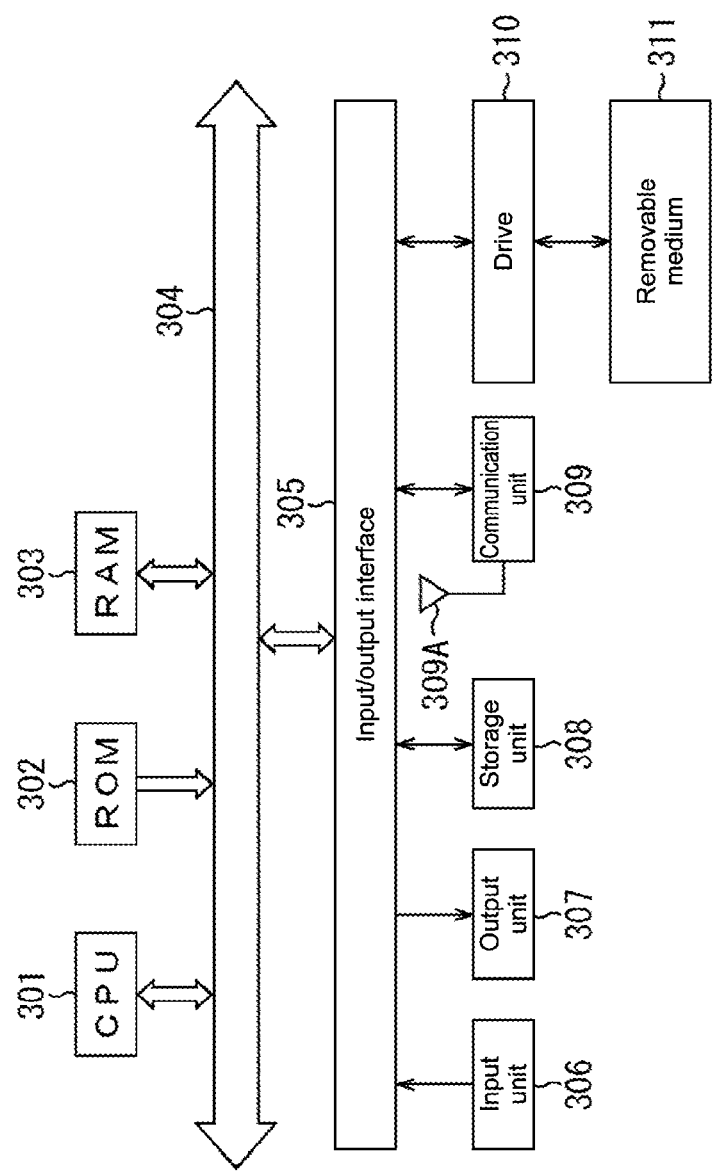
FIG. 22 is a block diagram showing a configuration example of a communication apparatus.

FIG. 22 is a block diagram showing a configuration example of a communication apparatus on which the coupler module 1 is mounted.

A CPU (Central Processing Unit) 301, a ROM (Read Only Memory) 302, and a RAM (Random Access Memory) 303 are connected to each other via a bus 304.

Further, an input/output interface 305 is connected to the bus 304. An input unit 306 including a keyboard, a mouse, and the like, and an output unit 307 including a display, a speaker, and the like are connected to the input/output interface 305. Further, to the input/output interface 305, a storage unit 308 including a hard disk or a non-volatile memory, a communication unit 309 that is a wireless communication module, and a drive 310 for driving a removable medium 311 are connected.

An antenna 309A is provided in the communication unit 309. The coupler module 1 is provided inside the communication unit 309 so as to be connected to the antenna 309A.

<3-3. Others>

Although the controller 11 is provided inside the coupler module 1 in the above description, but it may be provided outside the coupler module 1.

Although the number of couplers provided in the coupler module 1 is one, it is also possible to provide a plurality of couplers. The plurality of couplers may be any of a single directional coupler and a dual directional coupler.

The combination of the configurations can be arbitrarily set. For example, it is also possible to provide the filter part 61 and the attenuation part 62 shown in FIG. 10 in the coupler module 1 having another configuration such as those shown in FIG. 1, FIG. 6, and the like. It is also possible to provide the configuration used for adjusting the level of the CF signal at the front stage of the output port P11 shown in FIG. 11, FIG. 13, and FIG. 14 in the coupler module 1 having another configuration.

Embodiments of the present technology are not limited to the above-mentioned embodiments and examples, and various modifications can be made without departing from the essence of the present technology.

The effects described herein are merely examples and not limited, and another effect may be exerted.

Combination Example of Configurations

It should be noted that the present technology may take the following configurations.

(1)

A signal processing circuit, including:

a directional coupler having a main line as a transmission path of an RF signal and a sub-line constituting a coupled line together with the main line;

a termination part including a plurality of devices connectable between a first port and ground, the first port being one of ports on both ends of the sub-line; and a control unit that switches, depending on a frequency of the RF signal, the plurality of devices of the termination part to be connected to the first port, a phase of a return signal of a signal input as a coupling signal corresponding to the RF signal to the termination part via the first port being opposite to a phase of an isolation signal supplied to a second port, the second port being the other port of the sub-line and connected to an output port of the coupling signal.

(2)

The signal processing circuit according to (1) above, in which the control unit switches on/off of switches provided between a plurality of capacitors of the termination part and the first port and between a plurality of resistors of the termination part and the first port.

(3)

The signal processing circuit according to (1) or (2) above, further including a different termination part including a plurality of devices connectable between the second port and the ground, wherein
the first port is connected to the output port via a first switch, and
the second port is connected to the output port via a second switch.

(4)
The signal processing circuit according to (3) above, in which
when outputting the coupling signal corresponding to a traveling wave component of the RF signal from the output port, the control unit turns off the first switch, turns on the second switch, and switches the plurality of devices of the termination part to be connected to the first port.

(5)
The signal processing circuit according to (3) above, in which
when outputting the coupling signal corresponding to a reflected wave component of the RF signal from the output port, the control unit turns off the second switch, turns on the first switch, and switches the plurality of devices of the different termination part to be connected to the second port.

(6)
The signal processing circuit according to any one of (1) to (5) above, in which
an attenuation part and a filter part are provided between the second port and the output port, and
the control unit controls paths of the coupling signal in the attenuation part and paths of the coupling signal in the filter part.

(7)
The signal processing circuit according to any one of (1) to (5) above, in which
a path to which an inductor is connected in series and a path bypassing the inductor are provided in parallel between the second port and the output port, and
the control unit switches paths of the coupling signal depending on the frequency of the RF signal.

(8)
The signal processing circuit according to any one of (1) to (5) above, in which
a capacitor having one electrode connected to the ground is provided in parallel between the second port and the output port via a switch, and
the control unit switches on/off of the switch of the capacitor depending on the frequency of the RF signal.

(9)
The signal processing circuit according to any one of (1) to (5) above, in which
a path to which a resistor is connected in series and a path bypassing the resistor are provided in parallel between the second port and the output port, and
the control unit switches paths of the coupling signal depending on the frequency of the RF signal.

(10)
The signal processing circuit according to any one of (1) to (9) above, in which
the directional coupler includes a first sub-line and a second sub-line as the sub-line constituting the coupled line together with the main line, the first sub-line having the same line length as that of the main line, the second sub-line having a line length shorter than that of the main line,
the termination part is provided on a side of the first sub-line, and the termination part is provided on a side of the second sub-line, and
the control unit outputs the coupling signal to be transmitted through the first sub-line or the coupling signal to be transmitted through the second sub-line depending on the frequency of the RF signal.

(11)
The signal processing circuit according to (10) above, in which
the control unit
switches connection of the devices of the termination part on the side of the first sub-line to the first port and outputs the coupling signal to be transmitted through the first sub-line when the frequency of the RF signal is lower than a threshold value, and
switches connection of the devices of the termination part on the side of the second sub-line to the first port and outputs the coupling signal to be transmitted through the second sub-line when the frequency of the RF signal is higher than the threshold value.

(12)
A signal processing module, including:
a directional coupler having a main line as a transmission path of an RF signal and a sub-line constituting a coupled line together with the main line;
a termination part including a plurality of devices connectable between a first port and ground, the first port being one of ports on both ends of the sub-line; and
a control unit that switches, depending on a frequency of the RF signal, the plurality of devices of the termination part to be connected to the first port, a phase of a return signal of a signal input as a coupling signal corresponding to the RF signal to the termination part via the first port being opposite to a phase of an isolation signal supplied to a second port, the second port being the other port of the sub-line and connected to an output port of the coupling signal.

(13)
A communication apparatus, including:
a signal processing module mounted on the communication apparatus, the signal processing module including
a directional coupler having a main line as a transmission path of an RF signal and a sub-line constituting a coupled line together with the main line,
a termination part including a plurality of devices connectable between a first port and ground, the first port being one of ports on both ends of the sub-line, and
a control unit that switches, depending on a frequency of the RF signal, the plurality of devices of the termination part to be connected to the first port, a phase of a return signal of a signal input as a coupling signal corresponding to the RF signal to the termination part via the first port being opposite to a phase of an isolation signal supplied to a second port, the second port being the other port of the sub-line and connected to an output port of the coupling signal.

REFERENCE SIGNS LIST 1 coupler module
11 controller
21 coupler
22 termination part

The invention claimed is:
1. A signal processing circuit, comprising:
a directional coupler including a first line as a transmission path of an RF signal and a second line having a first port and a second port, wherein the second port is connected to an output port of a coupling signal;

a first termination part including first devices and first switching elements, the first devices being connected between the first port and ground, the first devices including a first capacitor and a first resistor;

a control circuit configured to control the first switching elements such that a phase of a first signal input to the first termination part via the first port is opposite to a phase of a second signal supplied to the second port;

a first contact portion connected between the second port and the output port; and a second switching element connected between the first contact portion and the ground.

2. The signal processing circuit according to claim 1, wherein the control circuit controls the first switching elements based on a frequency of the RF signal to cause the phase of the first signal input to the first termination part via the first port to be opposite to the phase of the second signal supplied to the second port.

3. The signal processing circuit according to claim 2, wherein the first signal is a return signal, and the second signal is an isolation signal.

4. The signal processing circuit according to claim 3, further comprising:

a third switching element connected between the first port and the output port; and a fourth switching element connected between the second port and the output port.

5. The signal processing circuit according to claim 4, further comprising:

a second termination part including second devices and second switching elements, the second devices being connected between the second port and ground.

6. The signal processing circuit according to claim 5, wherein the third switching element is connected between the first termination part and the output port, and the fourth switching element is connected between the second termination part and the output port.

7. The signal processing circuit according to claim 6, wherein when outputting the coupling signal corresponding to a traveling wave component of the RF signal from the output port, the control circuit turns off the third switching element, turns on the fourth switching element, and controls the first switching elements.

8. The signal processing circuit according to claim 6, wherein when outputting the coupling signal corresponding to a reflected wave component of the RF signal from the output port, the control circuit turns off the fourth switching element, turns on the third switching element, and controls a fifth switching element of the second termination part.

9. The signal processing circuit according to claim 8, further comprising:

an attenuation part and a filter part connected between the first port and the output port and between the second port and the output port.

10. The signal processing circuit according to claim 4, further comprising:

a second contact portion between the first port and the third switching element, the second contact portion connected to the first termination part, and a third contact portion between the second port and the fourth switching element, the third contact portion connected to the first termination part.

11. The signal processing circuit according to claim 1, further comprising:

an inductor or second resistor connected between the first contact portion and the second port, and a sixth switching element between the first contact portion and the second port, wherein the inductor or second resistor and sixth switching element are connected in parallel.

12. The signal processing circuit according to claim 11, wherein the control circuit is configured to switch a path including the inductor or resistance and a path including the sixth switching element based on the frequency of the RF signal.

13. The signal processing circuit according to claim 1, further comprising:

a fourth contact portion between the first contact and the second port, and a second capacitor between the forth contact portion and the ground.

14. The signal processing circuit according to claim 1, further comprising:

a third line connected to a third termination part.

15. The signal processing circuit according to claim 1, further comprising:

a third resistor and seventh switching element between the first port and the second port.

* * * * *